United States Patent
Cai et al.

(10) Patent No.: US 12,382,786 B2
(45) Date of Patent: Aug. 5, 2025

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jianchang Cai, Beijing (CN); Yue Long, Beijing (CN); Qiwei Wang, Beijing (CN); Yuanjie Xu, Beijing (CN); Yao Huang, Beijing (CN); Kaipeng Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 17/763,803

(22) PCT Filed: Apr. 30, 2021

(86) PCT No.: PCT/CN2021/091379
§ 371 (c)(1),
(2) Date: Mar. 25, 2022

(87) PCT Pub. No.: WO2022/226973
PCT Pub. Date: Nov. 3, 2022

(65) Prior Publication Data
US 2024/0057387 A1    Feb. 15, 2024

(51) Int. Cl.
*H10K 59/121* (2023.01)
*H10K 59/13* (2023.01)
*H10K 59/131* (2023.01)

(52) U.S. Cl.
CPC ......... *H10K 59/1216* (2023.02); *H10K 59/13* (2023.02); *H10K 59/131* (2023.02)

(58) Field of Classification Search
CPC ... H10K 59/1216; H10K 59/13; H10K 59/121
See application file for complete search history.

(56) References Cited

U.S. PATENT DOCUMENTS

| | | | |
|---|---|---|---|
| 2018/0158417 A1* | 6/2018 | Xiang | G09G 3/3258 |
| 2020/0152119 A1* | 5/2020 | Xuan | G09G 3/3233 |
| 2024/0172509 A1* | 5/2024 | Huang | H10K 59/1216 |
| 2024/0428734 A1* | 12/2024 | Wang | H10D 99/00 |

* cited by examiner

*Primary Examiner* — Mounir S Amer
(74) *Attorney, Agent, or Firm* — Lippes Mathias LLP

(57) ABSTRACT

Provided is a display panel. The display panel includes a first light-emitting element disposed in a first display region, and a first pixel circuit and a compensation capacitor that are disposed in a peripheral region. The first pixel circuit may be coupled to the first light-emitting element by a first connecting wire. A first metal layer in the compensation capacitor may be coupled to a target node, a second metal layer may be coupled to a power supply end, and the target node is a node via which the first connecting wire is coupled to the first pixel circuit.

20 Claims, 23 Drawing Sheets

DISPLAY PANEL AND DISPLAY DEVICE

CROSS-REFERENCE TO RELATED APPLICATION

This application is a 371 of PCT application No. PCT/CN2021/091379, filed on Apr. 30, 2021, the disclosure of which is incorporated herein by reference in its entirety.

TECHNICAL FIELD

The present disclosure relates to the field of display technologies, and in particular, relates to a display panel and a display device.

BACKGROUND

Organic light-emitting diode (OLED) display panels are widely used due to advantages such as self-illumination, low drive voltage, and high response speed. The OLED display panels generally include a plurality of pixel units. Each of the pixel units includes a light-emitting element and a pixel circuit coupled to the light-emitting element.

SUMMARY

Embodiments of the present disclosure provide a display panel and a display device. The technical solutions are as follows:

According to one aspect of the embodiments of the present disclosure, a display panel is provided. The display panel includes:
- a base substrate, including a first display region, a second display region, and a peripheral region, wherein the second display region at least partially surrounds the first display region, and the peripheral region at least partially surrounds the second display region;
- a plurality of first light-emitting elements in the first display region;
- a plurality of first pixel circuits in the peripheral region;
- a plurality of second pixel circuits and a plurality of second light-emitting elements in the second display region, wherein at least one of the second pixel circuits is coupled to at least one of the second light-emitting elements;
- at least one first connecting wire in the peripheral region, the second display region, and the first display region, wherein at least one of the first pixel circuits is coupled to at least one of the first light-emitting elements by the first connecting wire; and
- at least one compensation capacitor in the peripheral region, wherein the compensation capacitor includes a first metal layer and a second metal layer that are overlapped, the first metal layer being coupled to a target node, the second metal layer being coupled to a power supply end, and the target node being a node via which the first pixel circuits are coupled to the first connecting wires.

Optionally, a capacitance of the compensation capacitor corresponding to each of the first pixel circuits is negatively correlated with a length of the first connecting wire coupled.

Optionally, in the compensation capacitor corresponding to each of the first pixel circuits, an overlap region of two metal layers that are overlapped is negatively correlated with the length of the first connecting wire coupled.

Optionally, the display panel includes a plurality of pixel circuit groups, wherein each of the pixel circuit groups includes at least two of the first pixel circuits;
wherein capacitances of compensation capacitors corresponding to each of the pixel circuit groups are equal, and capacitances of compensation capacitors corresponding to different pixel circuit groups are different.

Optionally, the plurality of pixel circuit groups include: a first sub pixel circuit group, a second sub pixel circuit group, and a third sub pixel circuit group that are spaced apart successively along a pixel row direction;
wherein capacitances of compensation capacitors corresponding to the first sub pixel circuit group are less than capacitances of compensation capacitors corresponding to the second sub pixel circuit group, and capacitances of various compensation capacitors corresponding to the second sub pixel circuit group are greater than capacitances of compensation capacitors corresponding to the third sub pixel circuit group.

Optionally, the peripheral region includes a first area and a second area that are along a pixel column direction, wherein the second area is proximal to the second display region relative to the first area;
wherein each of the first pixel circuits is in the first area, and each of the at least one compensation capacitor is in the second area.

Optionally, the display panel includes a plurality of compensation capacitors, wherein the second metal layer in each of the compensation capacitors is of an integral structure, and first metal layers in each of the compensation capacitors are spaced apart along the pixel row direction.

Optionally, the at least one compensation capacitor includes a plurality of first-group compensation capacitors, wherein at least one of the first-group compensation capacitors includes a third metal layer and a fourth metal layer that are overlapped, and any two metal layers of the first metal layer, the second metal layer, the third metal layer, and the fourth metal layer are in different layers;
wherein the third metal layer is coupled to the target node, and the fourth metal layer is coupled to the power supply end.

Optionally, the at least one compensation capacitor further includes: a plurality of second-group compensation capacitors and a plurality of third-group compensation capacitors; and
wherein at least one of the first-group compensation capacitors further includes a first metal layer and a second metal layer that are overlapped, at least one of the second-group compensation capacitors further includes a first metal layer and a second metal layer that are overlapped, and at least one of the third-group compensation capacitors further includes a first metal layer and a second metal layer that are overlapped;
wherein the plurality of first-group compensation capacitors, the plurality of second-group compensation capacitors, and the plurality of third-group compensation capacitors are spaced apart successively along the pixel row direction, and heights of the first metal layers in the second-group compensation capacitors in the pixel column direction are greater than heights of the first metal layers in the third-group compensation capacitors along the pixel column direction, and greater than heights of the first metal layers in the second-group compensation capacitors along the pixel column direction.

Optionally, the pixel circuits in the display panel include: an active layer, a first gate metal layer, a second gate metal layer, a first source and drain metal layer, and a second source and drain metal layer that are successively along a direction going away from the base substrate;
   wherein the first metal layer is in a same layer as one of the first gate metal layer and the second gate metal layer, and the second metal layer is in a same layer as the other gate metal layer of the first gate metal layer and the second gate metal layer; and
   the third metal layer is in a same layer as one of the first source and drain metal layer and the second source and drain metal layer, and the fourth metal layer is in a same layer as the other source and drain metal layer of the first source and drain metal layer and the second source and drain metal layer.

Optionally, the first metal layer is in a same layer as the first gate metal layer, and the second metal layer is in a same layer as the second gate metal layer.

Optionally, the third metal layer is in a same layer as the first source and drain metal layer, and the fourth metal layer is in a same layer as the second source and drain metal layer.

Optionally, each of the compensation capacitors includes: the first metal layer and the second metal layer that are overlapped, and the third metal layer and the fourth metal layer that are overlapped.

Optionally, the fourth metal layer in each of the compensation capacitors is of an integral structure, and the third metal layers in each of the compensation capacitors are spaced apart along the pixel row direction.

Optionally, an orthographic projection of the first metal layers on the base substrate and an orthographic projection of the third metal layer on the base substrate are both of a strip-shaped structure, and the strip-shaped structure extends along the pixel column direction.

Optionally, the display panel further includes:
   at least one second connecting wire in the peripheral region, wherein both the first metal layer and the third metal layer are coupled to the target nodes by the at least one second connecting wire.

Optionally, the peripheral region includes: a first area, a third area, and a second area that are along the pixel column direction, wherein the second area is proximal to the second display region relative to the first area; and the first metal layer is coupled to the second connecting wires by a first via hole, and the third metal layer is coupled to the first metal layers by a second via hole;
   wherein the first via hole is in the third area of the peripheral region, and the second via hole is in the first area of the peripheral region.

Optionally, the display panel further includes: a first planarization layer, a second planarization layer, and a third planarization layer that are successively along a direction of the first via holes distal from the base substrate;
   wherein an orthographic projection of the first planarization layer on the base substrate covers an orthographic projection of the first via hole on the base substrate, an orthographic projection of the second planarization layer on the base substrate covers the orthographic projection of the first via hole on the base substrate, and an orthographic projection of the third planarization layer on the base substrate is not overlapped with the orthographic projection of the first via hole on the base substrate.

Optionally, the first planarization layer, the second planarization layer, and the third planarization layer are all on a side of the second connecting wire distal from the base substrate.

Optionally, the second connecting wire is in a same layers as the second source and drain metal layers in the pixel circuits of the display panel.

Optionally, the display panel includes at least one compensation capacitor in a one-to-one correspondence with the at least one first connecting wire;
   wherein each of the at least one compensation capacitor is coupled to a corresponding one of the at least one first connecting wire at the target node.

Optionally, the display panel includes a plurality of first connecting wires, and at least two first connecting wires of the plurality of first connecting wires are in different layers.

Optionally, the plurality of first connecting wires include at least one first type first connecting wire in a same layer, at least one second type first connecting wire in a same layer, and at least one third type first connecting wire in a same layer; and
   wherein first connecting wires of any two types of the first type first connecting wire, the second type first connecting wire, and the third type first connecting wire are in different layers.

Optionally, the first connecting wire is transparent conductive wire.

According to another aspect of the embodiments of the present disclosure, a display device is provided, wherein the display device includes: a photosensitive sensor and a display panel according to the aspect as described above,
   wherein the photosensitive sensor is in the first display region of the display panel.

BRIEF DESCRIPTION OF THE DRAWINGS

For clearer descriptions of the technical solutions in the embodiments of the present disclosure, the following will briefly introduce the accompanying drawings required for describing the embodiments. It is obvious that the accompanying drawings in the following description show merely some embodiments of the present disclosure, and persons of ordinary skills in the art may still derive other drawings from these accompanying drawings without creative efforts.

DETAILED DESCRIPTION

For clearer descriptions of the objectives, technical solutions, and advantages of the present disclosure, the present disclosure will be described in detail hereinafter in combination with the accompanying drawings.

With the development of display technologies, existing notch screen or water drop screen designs have gradually failed to meet users' demands for high screen-to-body ratios of display panels. A series of OLED display panels of high PPI with light-transmissive display regions have emerged. PPI is a unit of resolution, called pixel per inch in English, and represents the number of pixels per inch of a display panel. In this kind of display panels, hardware such as a photosensitive sensor (for example, a camera) may be provided in the light-transmissive display region. As such, the light-transmissive display region may also be called an under-screen camera area. In the embodiments of the present disclosure, a first display region is used to refer to the under-screen camera area.

In the embodiments of the present disclosure, the under-screen camera area only retains an electroluminescence (EL) device, which is a first light-emitting element disclosed in the embodiments of the present disclosure. A pixel circuit (namely, a first pixel circuit disclosed in the embodiments of the present disclosure) driving the EL device within the under-screen camera area to emit light is disposed in a peripheral region (for example, an upper frame of the display panel) surrounding the under-screen camera area. Then, the first pixel circuit and the first light-emitting element are coupled by a conductive wire (namely, a first connecting wire disclosed in the embodiments of the present disclosure), thereby implementing a reliable driving for the first light-emitting element. The coupling may refer to an electrical connection.

Figure 1:
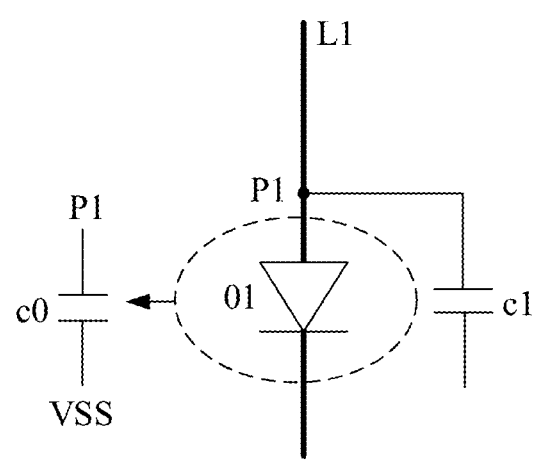
FIG. 1 is a schematic diagram of coupling of a first connecting wire with a light-emitting element according to an embodiment of the present disclosure.

For example, FIG. 1 shows a schematic diagram of coupling of a first connecting wire with a first light-emitting element. Referring to FIG. 1, the first connecting wire L1 may extend to the first light-emitting element 01 via a first pixel circuit (not shown), and is coupled to an anode of the light-emitting element 01. Assuming that a node coupled to the first light-emitting element 01 is denoted as P1, then referring to FIG. 1, a parasitic capacitor c0 is disposed between the node P1 and a cathode of the first light-emitting element 01, and a parasitic capacitor c1 is also disposed on the first connecting wire L1.

With a test, since distances between the first pixel circuits at different positions and the first light-emitting elements coupled are different, lengths of various first connecting wires provided in a display panel are different. Thus, the parasitic capacitor c1 shown in FIG. 1 above has different magnitudes. That is, magnitudes of capacitances at the nodes P1 of different first light-emitting elements 01 are different. Thus, different first light-emitting elements 01 have different light-emitting luminance, which affects display effects.

According to an embodiment of the present disclosure, a display panel including a compensation capacitor is provided. The compensation capacitor can implement an effective compensation for the capacitances at the nodes P1, such that different first light-emitting elements have better uniformity of light-emitting luminance, thereby achieving the purpose of display effects of the under-screen camera area keeping consistent with those of other normal display areas.

Figure 2:
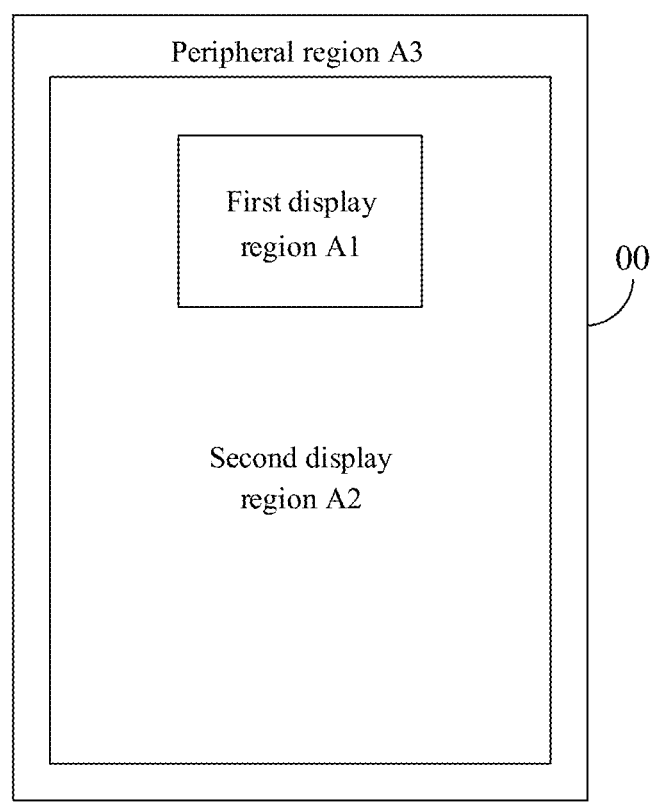
FIG. 2 is a schematic structural diagram of a display panel according to an embodiment of the present disclosure.

FIG. 2 is a schematic structural diagram of a display panel according to an embodiment of the present disclosure. As shown in FIG. 2, the display panel may include a base substrate 00. The base substrate 00 may include a first display region A1, a second display region A2, and a peripheral region A3. The second display region A2 may at least partially surrounds the first display region A1, and the peripheral region A3 may at least partially surrounds the second display region A2.

For example, the first display region A1 shown in FIG. 2 is disposed in a middle position above the base substrate 00, and the second display region A2 surrounds the first display region A1, that is, the first display region A1 is surrounded by the second display region A2. Furthermore, the peripheral region A3 surrounds the second display region A2, that is, the second display region A2 is surrounded by the peripheral region A3.

In some embodiments, the first display region A1 may not be disposed in the position shown in FIG. 2 as well, but may be disposed in other positions on the base substrate 00. For example, in combination with FIG. 2, the first display region A1 may be disposed in a position in an upper left corner or a position in an upper right corner of the base substrate 00.

Figure 3:
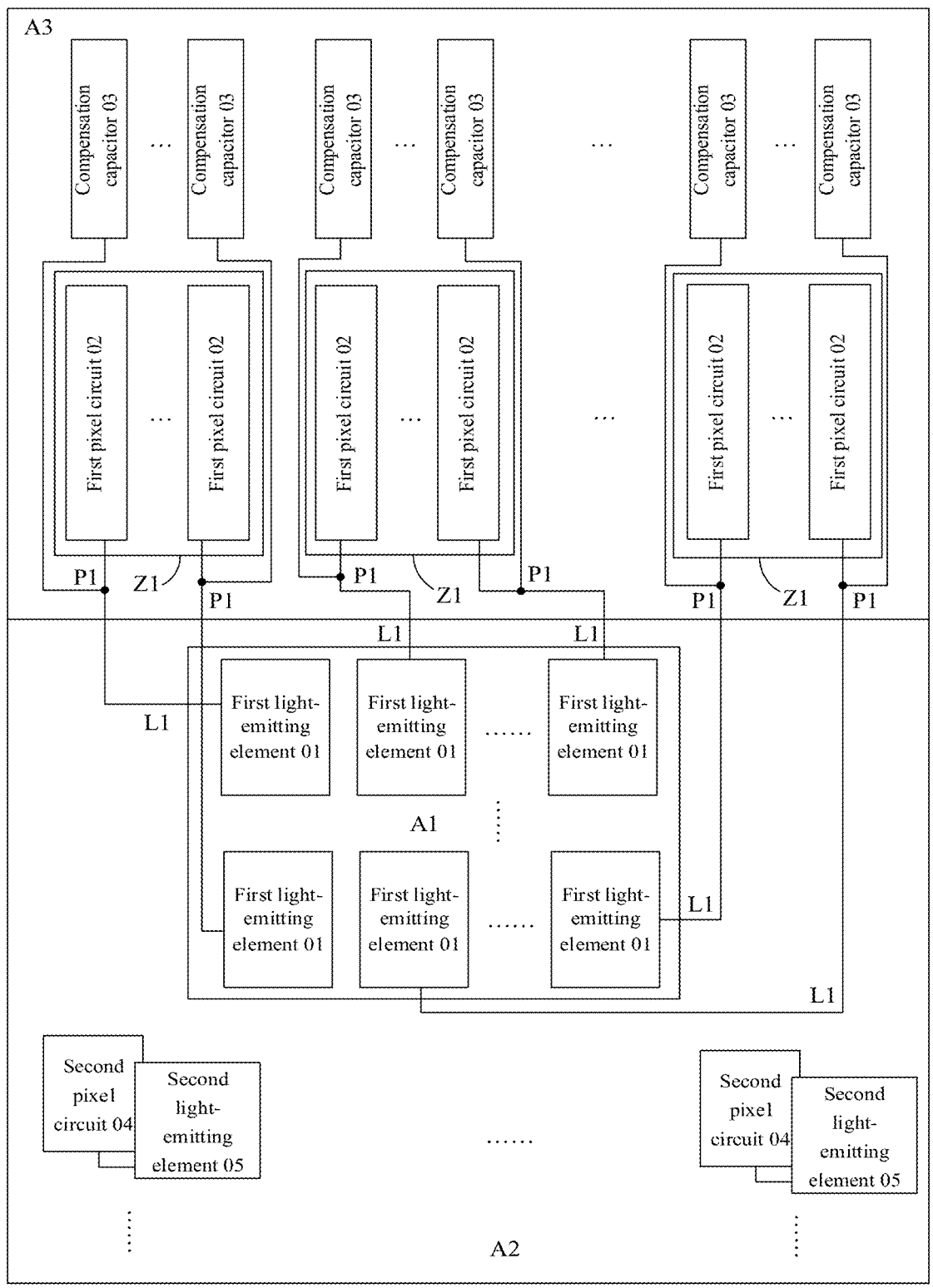
FIG. 3 is a schematic structural diagram of another display panel according to an embodiment of the present disclosure.

FIG. 3 is a schematic structural diagram of another display panel according to an embodiment of the present disclosure. In combination with FIG. 2 and FIG. 3, the display panel may further include: a plurality of first light-emitting elements 01 disposed in the first display region A1; a plurality of first pixel circuits 02 and at least one compensation capacitor 03 that are disposed in the peripheral region A3; a plurality of second pixel circuits 04 and a plurality of second light-emitting elements 05 that are disposed in the second display region A2; and at least one first connecting wire L1 disposed in the peripheral region A3, the second display region A2, and the first display region A1.

At least one of the plurality of first pixel circuits 02 may be coupled to at least one of the plurality of first light-emitting elements 01 by the first connecting wire L1. That is, referring to FIG. 3, one end of the first connecting wire L1 may be coupled to the first pixel circuit 02 (the point of coupling is the target node P1 shown in the figure), and the other end of the first connecting wire L1 may be coupled to the first light-emitting element 01. As such, an effective coupling of the first pixel circuit 02 with the first light-emitting element 01 is implemented. The at least one first pixel circuit 02 may be used for providing a driving signal for the first light-emitting element 01 coupled, so as to drive the first light-emitting element 01 to emit light. At least one of the plurality of second pixel circuits 04 may be coupled to at least one of the plurality of second light-emitting elements 05. The at least one second pixel circuit 04 may be used for providing a driving signal for the second light-emitting element 05 coupled, so as to drive the second light-emitting element 05 to emit light. For example, in the display panel shown in FIG. 3, each second pixel circuit 04 is coupled to one second light-emitting elements 05. Each compensation capacitor 03 may be coupled to one target node P1 to implement compensation for the capacitance at the target node P1.

Figure 4:
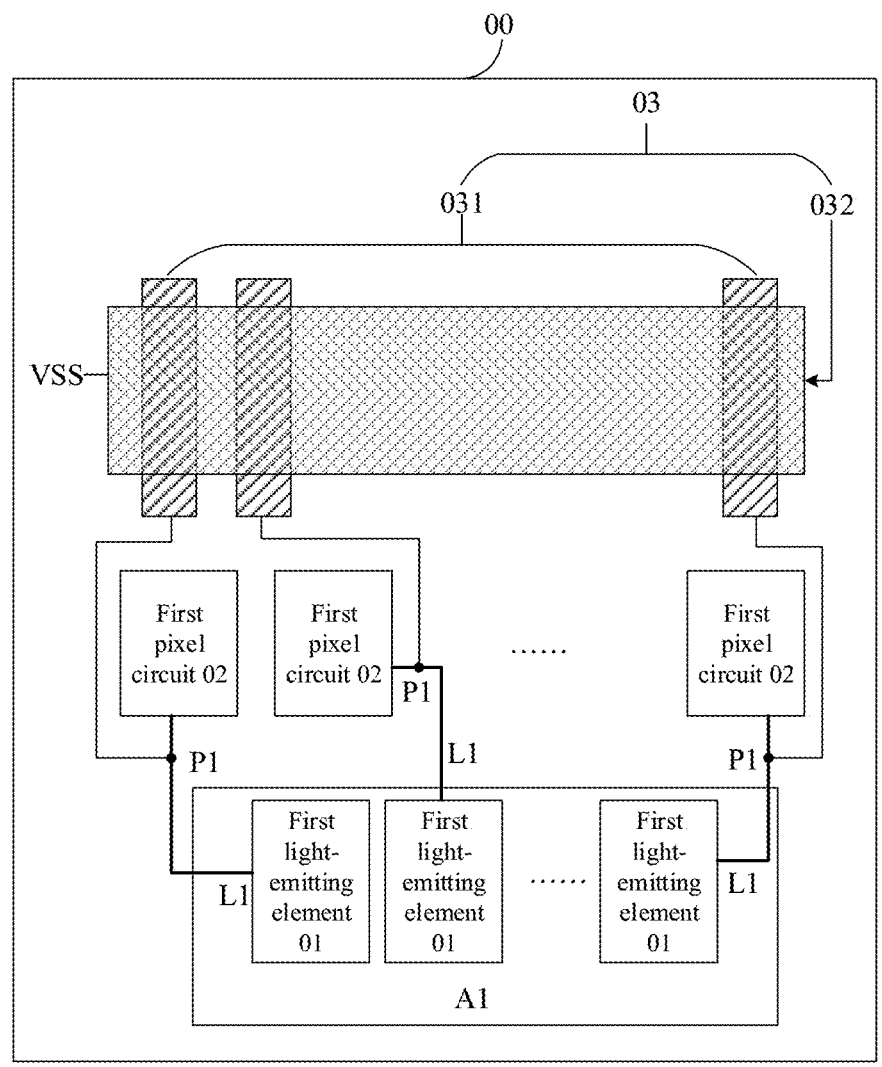
FIG. 4 is a schematic structural diagram of yet another display panel according to an embodiment of the present disclosure.

Optionally, FIG. 4 is a schematic structural diagram of yet another display panel according to an embodiment of the present disclosure. In combination with FIG. 3 and FIG. 4, each compensation capacitor 03 may include first metal layers 031 and a second metal layer 032 that are overlapped. The first metal layers 031 may be coupled to the target nodes P1, and the second metal layer 032 may be coupled to a power supply end VSS. Thus, the compensation capacitor 03 can be effectively formed by overlapping the first metal layers 031 with the second metal layer 032.

Figure 5:
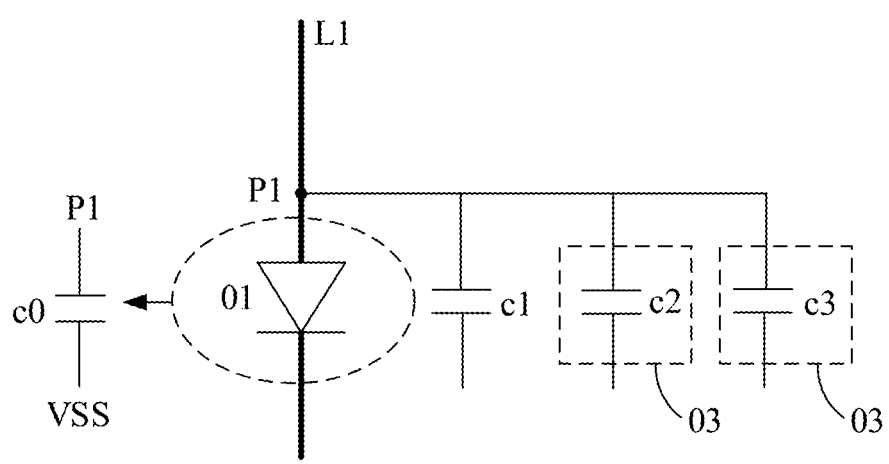
FIG. 5 is a schematic diagram of another coupling of a first connecting wire with a light-emitting element according to an embodiment of the present disclosure.

In an exemplary embodiment, based on the structure shown in FIG. 1, in combination with the compensation capacitor 03 shown in FIG. 4, FIG. 5 shows an optional circuit structure of a capacitor c2 (namely, the compensation capacitor 03) formed by overlapping the first metal layers 031 with the second metal layer 032. From the comparison of FIG. 1 with FIG. 5, the capacitor c2 is additionally added at the target node P1 according to the embodiments of the present disclosure.

Furthermore, based on a calculation formula for capacitances of a capacitor "C=εS/d (where ε is a dielectric constant of a medium between polar plates (that is, for forming the metal layers of the compensation capacitors), S is the overlap region between the polar plates, and d is the distance between the polar plates)" and the principle that the lengths of the first connecting wires L1 are positively correlated with a capacitance of a parasitic capacitor, in an embodiment of the present disclosure, the overlap region of the first metal layers 031 and the second metal layer 032 and/or the distances between the first metal layers 031 and the second metal layer 032 may be set flexibly based on the lengths of the first connecting wires L1, so as to achieve the effective compensations for the target nodes P1. Different first light-emitting elements are enabled to have better uniformity of light-emitting luminance.

Optionally, the first display region A1 may be a light-transmissive display region, the second display region A2 may be a light non-transmitting display region, and the peripheral region A3 may be a non-display region. That is, the first display region A1 disclosed in the embodiments of the present disclosure can transmit light, and a hardware structure needed for a display device such as a photosensitive sensor may be provided in the first display region A1. As such, it not only lays the foundation for the realization of a true full screen, but also achieves better light transmittance of the first display region A1 and better resolution of the display panel because only the first light-emitting elements 01 are included within the first display region A1, and the first pixel circuits 02 driving the first light-emitting elements 01 to emit light are not included.

Optionally, the resolution of the first display region A1 may be less than or equal to the resolution of the second display region A2. For example, the area of the first display region A1 may be the same as the area of the second display region A2, and the number of first light-emitting elements 01 in the first display region A1 is also the same as the number of second light-emitting elements 05 in the second display region A2. Or, as shown in FIG. 2 and FIG. 3, the area of the first display region A1 may be less than the area of the second display region A2, and the number of first light-emitting elements 01 in the first display region A1 may be less than the number of second light-emitting elements 05 in the second display region A2. As such, the second display region A2 may also be called a main display region. Or, the resolution of the first display region A1 may be greater than the resolution of the second display region A2. That is, the area of the first display region A1 may be greater than the area of the second display region A2, and the number of first light-emitting elements 01 in the first display region A1 may be greater than the number of second light-emitting elements 05 in the second display region A2.

In summary, in an embodiment of the present disclosure, a display panel is provided. The display panel includes a first light-emitting element disposed in a first display region, and a first pixel circuit and a compensation capacitor that are disposed in a peripheral region. The first pixel circuit may be coupled to the first light-emitting element by a first connecting wire. A first metal layer in the compensation capacitor may be coupled to a target node, a second metal layer may be coupled to a power supply end, and the target node is a node via which the first connecting wire is coupled to the first pixel circuit. As such, an effective compensation for a parasitic capacitor on the first connecting wire can achieve better uniformity of light-emitting luminance of various first light-emitting elements in the first display region, and thus, the display panel can achieve better display effects.

In an embodiment of the present disclosure, capacitances of the compensation capacitors 03 corresponding to various first pixel circuits 02 are negatively correlated with the lengths of the first connecting wires L1 coupled. That is, the longer the lengths of the first connecting wires L1 are, the smaller the capacitances of the compensation capacitors 03 are; and the shorter the lengths of the first connecting wires L1 are, the larger the capacitances of the compensation capacitors 03 are. The compensation capacitors 03 corresponding to the first pixel circuits 02 refer to: the compensation capacitors 03 with which the target nodes P1 in the first pixel circuits 02 are coupled.

The lengths of the first connecting wires L1 are generally positively correlated with existing parasitic capacitors. That is, the longer the lengths of the first connecting wires L1 are, the larger capacitances of the parasitic capacitors on the first connecting wires L1 are, and the shorter the lengths of the first connecting wires L1 are, the smaller the capacitances of the parasitic capacitors on the first connecting wires L1 are. Moreover, for the first connecting wires L1 with a larger parasitic capacitor, the capacitances of the corresponding compensation capacitors 03 should be smaller, that is, they may be compensated less. On the contrary, for the first connecting wires L1 with a smaller parasitic capacitor, the capacitances of the corresponding compensation capacitors 03 should be larger, that is, they may be compensated more. Therefore, the capacitances of the compensation capacitors 03 corresponding to the first pixel circuits 02 may be set to be negatively correlated with the lengths of the first connecting wires L1 coupled, such that different first light-emitting elements 01 coupled to different first connecting wires L1 may have the same luminance as much as possible, so as to achieve better uniformity of light-emitting luminance of various first light-emitting elements 01, and thus, the display effects of the display panel can be improved effectively Optionally, based on the calculation formula for capacitances of a capacitor disclosed in the above embodiment, in an embodiment of the present disclosure, it may be configured in the compensation capacitors 03 corresponding to various first pixel circuits 02 that the overlap region of two metal layers that are overlapped is negatively correlated with the length of the first connecting wire L1 coupled.

For example, referring to FIG. 4, it is assumed that the compensation capacitor 03 includes the first metal layers 031 and the second metal layer 032 that are overlapped. If the length of the first connecting wire L1 is longer, the overlap region of the first metal layers 031 and the second metal layer 032 may be set to be smaller. On the contrary, if the length of the first connecting wire L1 is shorter, the overlap region of the first metal layers 031 and the second metal layer 032 may be set to be larger. For a structure including other metal layers overlapped, the principle of setting is similar, which will not be described again in subsequent embodiments.

Optionally, in an embodiment of the present disclosure, in combination with FIG. 3, the display panel may further include a plurality of pixel circuit groups. Each pixel circuit group may include at least two first pixel circuits 02.

Capacitances of compensation capacitors 03 corresponding to each pixel circuit group may be the same, and capacitances of compensation capacitors 03 corresponding to a different pixel circuit group may be different.

Figure 6:
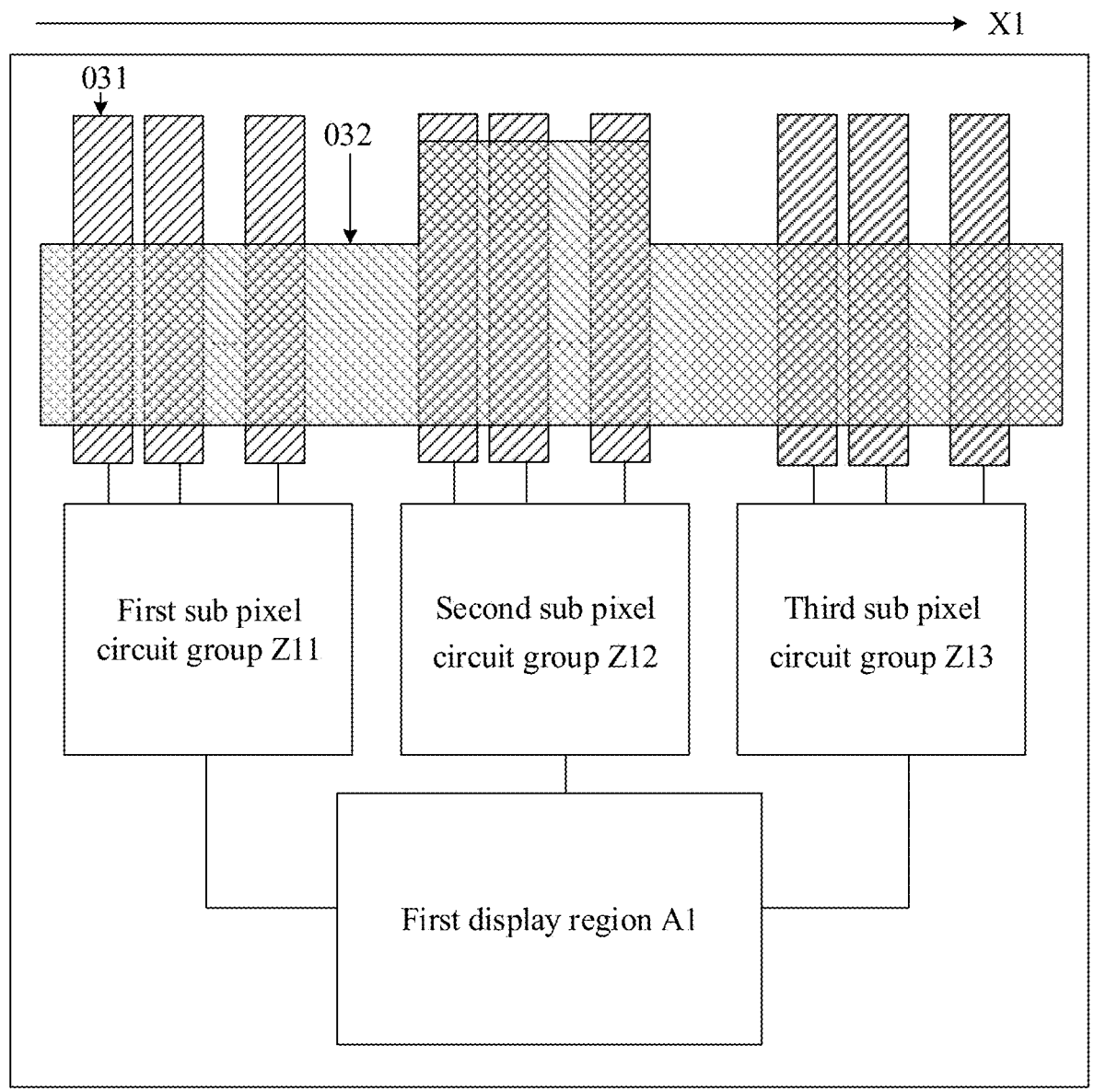
FIG. 6 is a schematic structural diagram of still another display panel according to an embodiment of the present disclosure.
Figure 7:
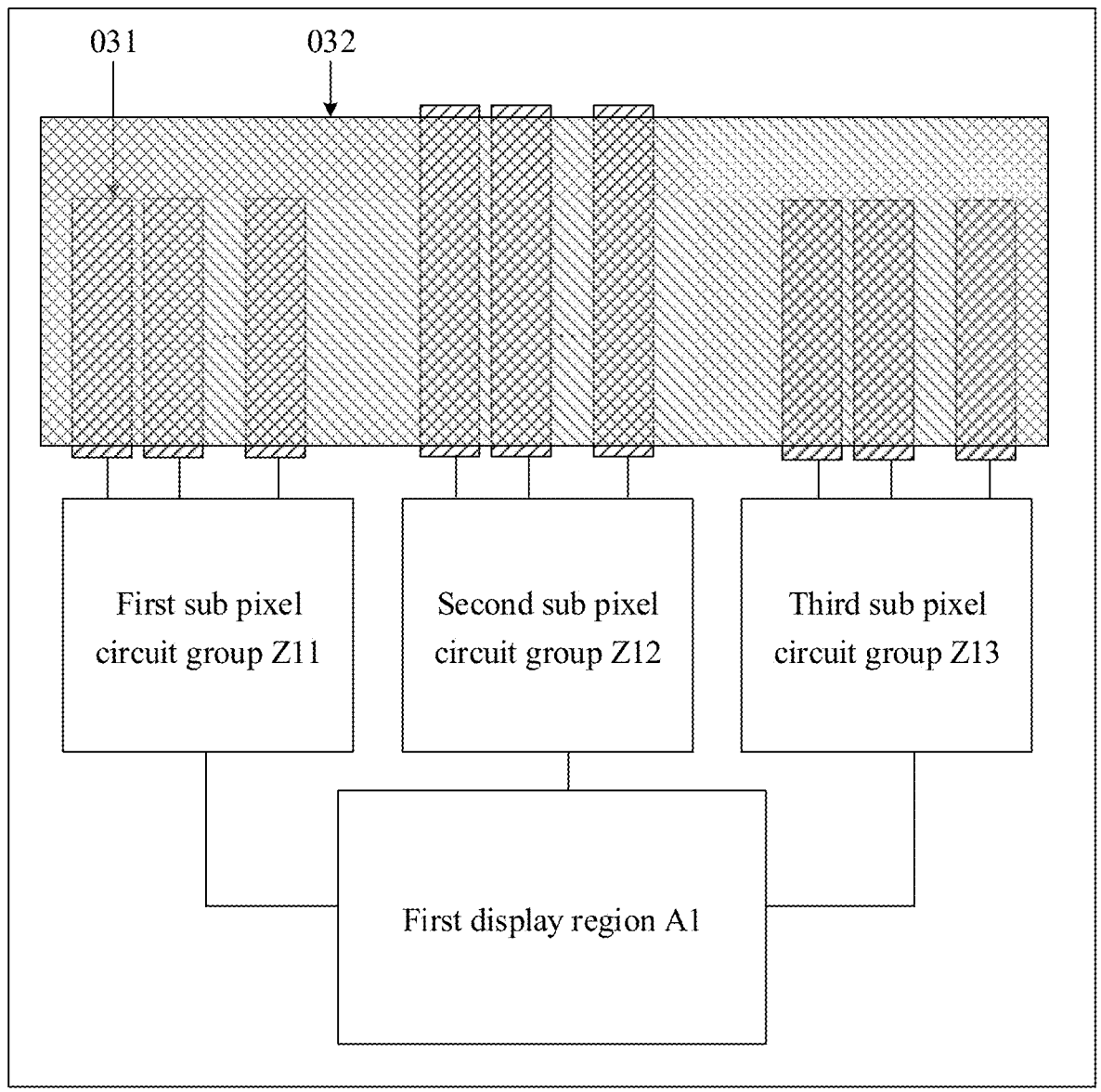
FIG. 7 is a schematic structural diagram of still another display panel according to an embodiment of the present disclosure.

For example, referring to FIG. 6 and FIG. 7, it is assumed that the plurality of pixel circuit groups may include a first sub pixel circuit group Z11, a second sub pixel circuit group Z12, and a third sub pixel circuit group Z13 that are spaced apart successively along a pixel row direction X1. That is, the second sub pixel circuit group Z12 is proximal to the first display region A1 relative to the first sub pixel circuit group Z11 and the third sub pixel circuit group Z13. It can be determined that for the second sub pixel circuit group Z12 compared with the first sub pixel circuit group Z11 and the third sub pixel circuit group Z13, first pixel circuits 02 in the second sub pixel circuit group Z12 are proximal to the first light-emitting elements 01, and the first connecting wires L1 used for coupling first pixel circuits 02 with the first light-emitting elements 01 are shorter. Therefore, still referring to FIG. 6 and FIG. 7, a capacitance of each compensation capacitor 03 corresponding to the first sub pixel circuit group Z11 is less than a capacitance of each compensation capacitor 03 corresponding to the second sub pixel circuit group Z12, and a capacitance of each compensation capacitor 03 corresponding to the second sub pixel circuit group Z12 may be greater than a capacitance of each compensation capacitor 03 corresponding to the third sub pixel circuit group Z13. That is, the capacitances of the compensation capacitors 03 needed to be set decrease progressively along a direction of the second sub pixel circuit group Z12 approaching toward the first sub pixel circuit group Z11 and along a direction of the second sub pixel circuit group Z12 approaching toward the third sub pixel circuit group Z13.

It should be noted that in both FIG. 6 and FIG. 7, the overlap region of the first metal layers 031 and the second metal layer 032 is taken as an example, showing the capacitances of the compensation capacitors 03 corresponding to different pixel circuit groups. Moreover, in FIG. 6, the second metal layer 032 is set to be of a "convex" form structure, and heights of the first metal layers 031 corresponding to different pixel circuit groups are set to be the same, such that the overlap regions of the first metal layers 031 and the second metal layers 032 in the compensation capacitors 03 corresponding to different pixel circuit groups Z1 are different. In FIG. 7, heights of the first metal layers 031 corresponding to different pixel circuit groups Z1 are set to be different, and the second metal layer 032 is set to be of a rectangular structure, such that the overlap regions of the first metal layers 031 and the second metal layers 032 in the compensation capacitors 03 corresponding to different pixel circuit groups Z1 are different. Furthermore, neither specific structures of various pixel circuit groups Z1 nor the first light-emitting elements 01 in the first display region A1 are shown in FIG. 6 and FIG. 7.

In combination with FIG. 6 and FIG. 7, it can be determined that in the embodiments of the present disclosure, the structure of either of two metal layers overlapped may be adjusted flexibly to change the overlap region of the two metal layers.

Optionally, in an embodiment of the present disclosure, the display panel may include at least one compensation capacitor 03 in a one-to-one correspondence with at least one first connecting wire L1, and each compensation capacitor 03 is coupled to a corresponding one of the first connecting wires L1 at the target node P1. That is, one compensation capacitor 03 is provided corresponding to each first connecting wire L1 in the display panel.

Figure 8:
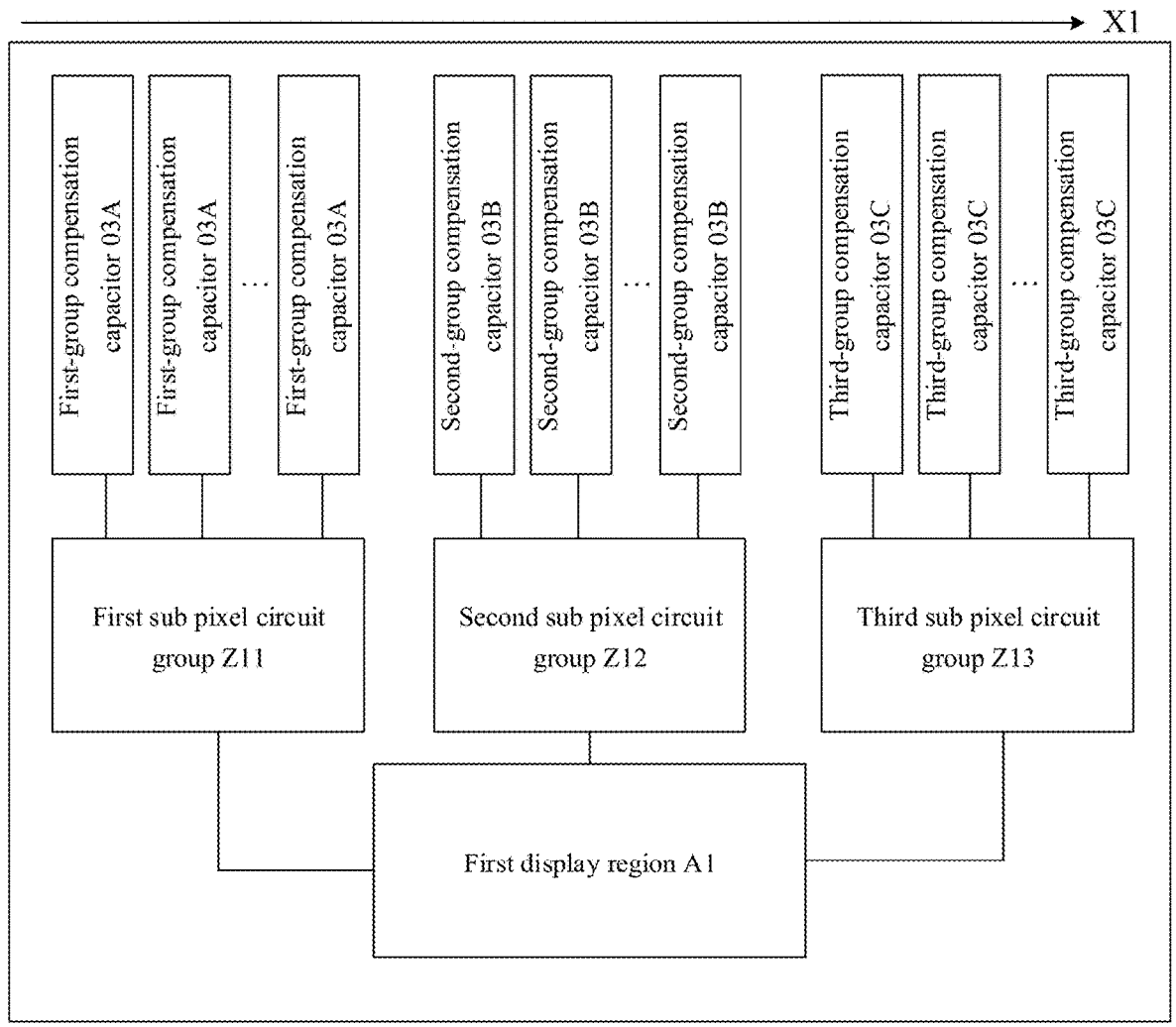
FIG. 8 is a structural layout of a compensation capacitor according to an embodiment of the present disclosure.

Optionally, FIG. 8 is a schematic structural diagram of still another display panel according to an embodiment of the present disclosure. As shown in FIG. 8, at least one compensation capacitor 03 in the display panel may include a plurality of first-group compensation capacitors 03A. Neither specific structures of the pixel circuit group nor the first light-emitting elements 01 in the first display region A1 are shown in FIG. 8.

Figure 9:
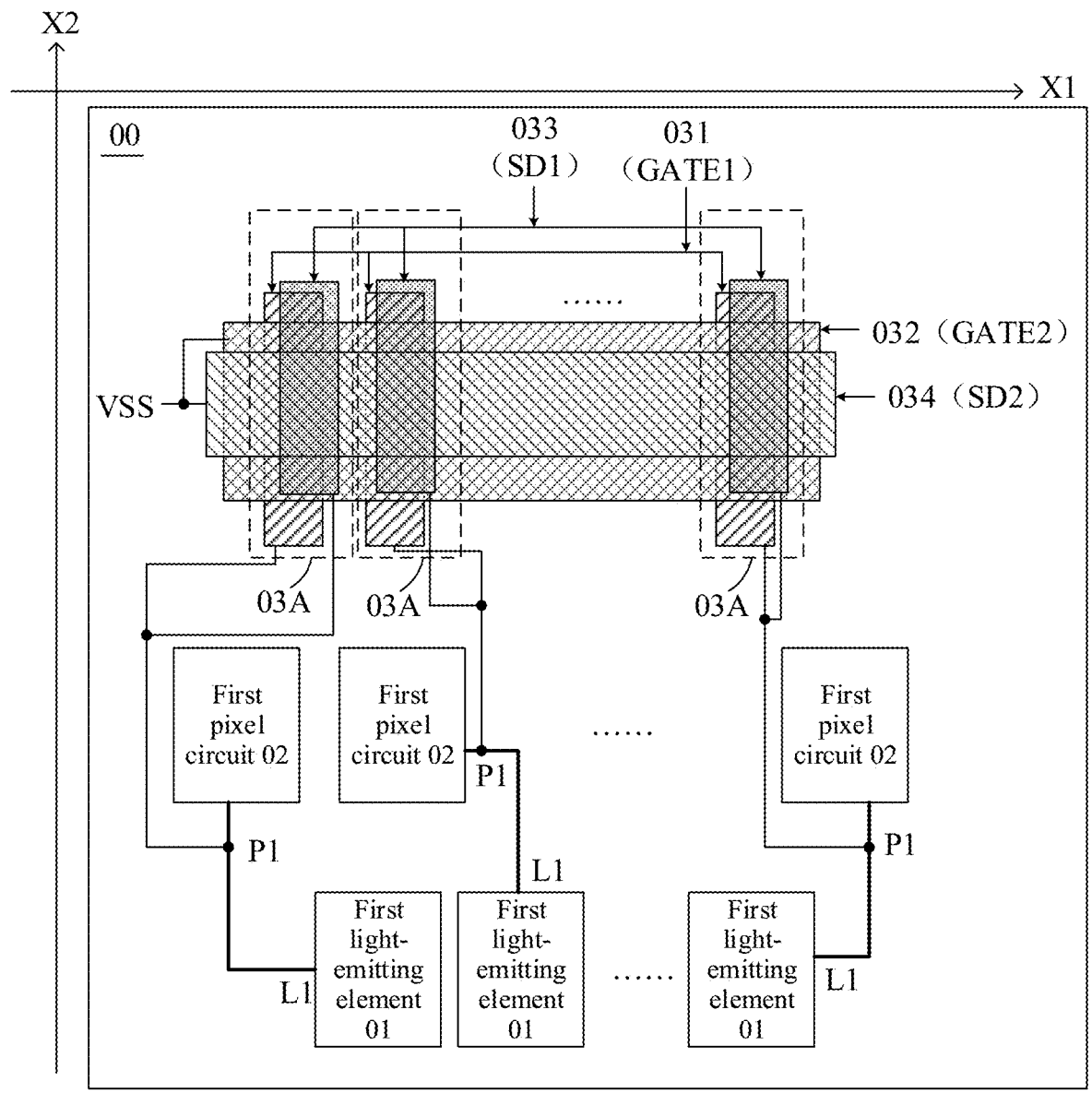
FIG. 9 is a structural layout of part of metal layers in a compensation capacitor according to an embodiment of the present disclosure.

FIG. 9 is a schematic structural diagram of still another display panel according to an embodiment of the present disclosure. As shown FIG. 9, at least one of the plurality of first-group compensation capacitors 03A may include third metal layers 033 and a fourth metal layer 034 that are overlapped. The third metal layers 033 may be coupled to the target nodes P1, and the fourth metal layer 034 may be coupled to the power supply end VSS. Thus, one compensation capacitor 03 may be then effectively formed by overlapping the third metal layers 033 with the fourth metal layer 034.

For example, each first-group compensation capacitor 03A shown in FIG. 9 includes the third metal layers 033 and the fourth metal layer 034 that are overlapped, and further includes the first metal layers 031 and the second metal layer 032 that are overlapped.

Furthermore, still referring to FIG. 8, the at least one compensation capacitor 03 may further include a plurality of second-group compensation capacitors 03B and a plurality of third-group compensation capacitors 03C.

The at least one first-group compensation capacitor 03A may further include the first metal layers 031 and the second metal layer 032 that are overlapped. At least one second-group compensation capacitor 03B may include the first metal layers 031 and the second metal layer 032 that are overlapped and the third metal layers 033 and the fourth metal layer 034 that are overlapped. At least one third-group compensation capacitor 03C may include the first metal layers 031 and the second metal layer 032 that are overlapped and the third metal layers 033 and the fourth metal layer 034 that are overlapped. It should be noted that only optional structures of the first-group compensation capacitors 03A are shown in FIG. 9.

Optionally, in combination with FIG. 8, the plurality of first-group compensation capacitors 03A may correspond to the first sub pixel circuit group Z11, the plurality of second-group compensation capacitors 03B may correspond to the second sub pixel circuit group Z12, and the plurality of third-group compensation capacitors 03C may correspond to the third sub pixel circuit group Z13.

Figure 10:
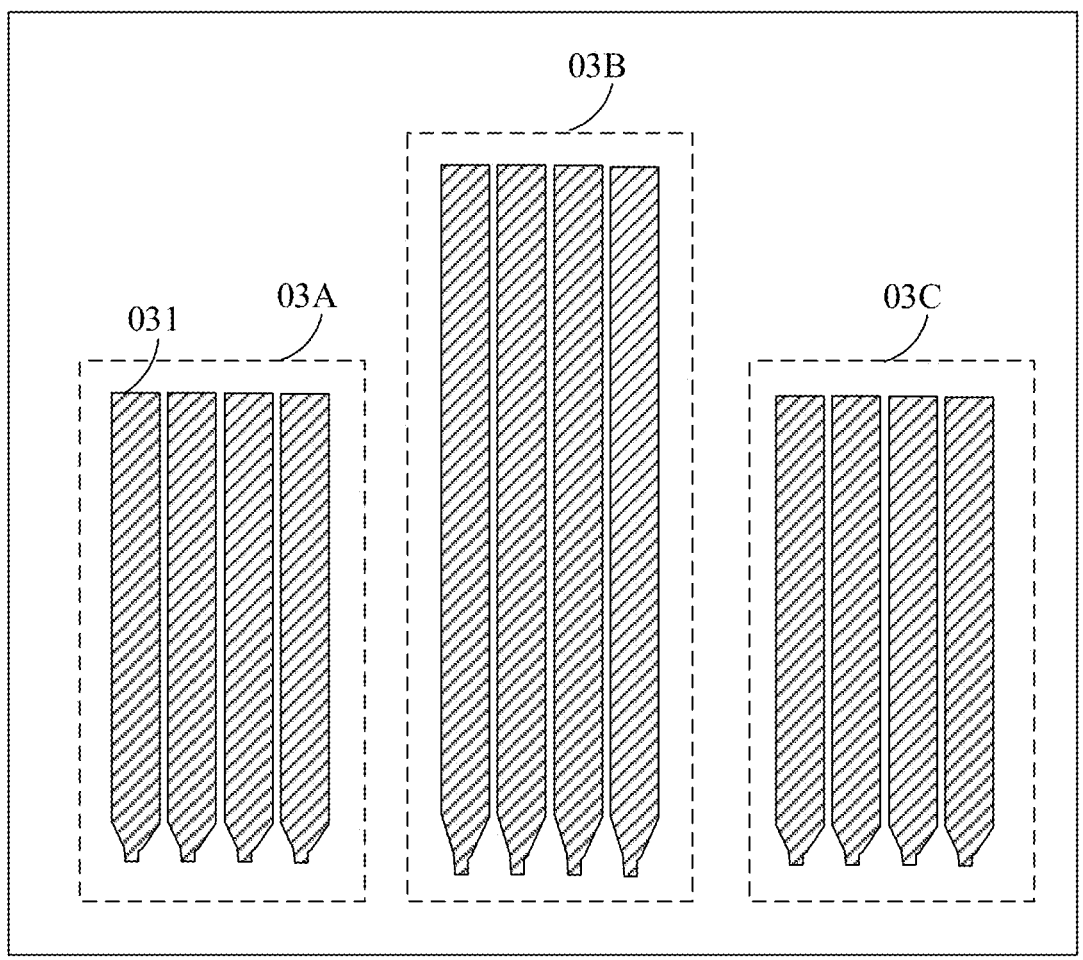
FIG. 10 is a structural layout of a first metal layer in the compensation capacitor according to an embodiment of the present disclosure.

As such, if the overlap regions of the first metal layers 031 and the second metal layers 032 are represented by the heights of the first metal layers 031 along a pixel column direction X2, referring to FIG. 7 and FIG. 10, the heights of the first metal layers 031 in the second-group compensation capacitors 03B along the pixel column direction X2 may be greater than the heights of the first metal layers 031 in the third-group compensation capacitors 03C along the pixel column direction X2, and may be greater than the heights of the first metal layers 031 in the first-group compensation capacitors 03A along the pixel column direction X2. That is, the heights of the first metal layers 031 decrease progressively along a direction of the second-group compensation capacitors 03B approaching toward the first-group compensation capacitors 03A and along a direction of the second-group compensation capacitors 03B approaching toward the third-group compensation capacitors 03C.

Optionally, in combination with the above embodiments, in the plurality of compensation capacitors 03 in the display panel, each compensation capacitor 03 of at least part of the compensation capacitors 03 may be formed by the first metal layers 031 and the second metal layer 032 that are overlapped. Or, each compensation capacitor 03 of at least part of the compensation capacitors 03 may be formed by the third metal layers 033 and the fourth metal layer 034 that are overlapped. Or, each compensation capacitor 03 of at least part of the compensation capacitors 03 may be formed by the first metal layers 031 and the second metal layer 032 that are overlapped, and by the third metal layers 033 and the fourth metal layer 034 that are overlapped. That is, each compensation capacitor 03 may include two types of capacitors.

For example, in combination with the display panel shown in FIG. 9, each compensation capacitor 03 includes the first metal layers 031 and the second metal layer 032 that are overlapped and the third metal layers 033 and the fourth metal layer 034 that are overlapped. That is, each compensation capacitor 03 may include two types of capacitors formed by four metal layers. The effective compensations for the capacitances of the target nodes P1 may be further implemented by providing a greater number of compensation capacitors 03.

On this basis, it may also be determined that the number of metal layers in the compensation capacitors 03 may also be adjusted according to the lengths of the first connecting wires L1, so as to set the capacitances of the compensation capacitors 03. Moreover, based on the relationship that the lengths of the first connecting wires L1 are negatively correlated with the compensation capacitors 03 and the principle that the capacitances increase if the capacitors are in parallel, as the lengths of the first connecting wires L1 increase, the compensation capacitors 03 may be configured to only include the first metal layers 031 and the second metal layers 032 that are overlapped; and as the lengths of the first connecting wires L1 decrease, the compensation capacitors 03 may be configured to include the first metal layers 031 and the second metal layers 032 that are overlapped and the third metal layers 033 and the fourth metal layers 034 that are overlapped.

In an exemplary embodiment, based on the structure shown in FIG. 1, in combination with the compensation capacitor 03 shown in FIG. 9, FIG. 5 further shows an optional circuit structure of a capacitor c3 (namely, the compensation capacitor 03) formed by overlapping the third metal layers 033 with the fourth metal layer 034. That is, from the comparison of FIG. 1 with FIG. 5, the capacitor c3 is additionally added at the target node P1 according to the embodiments of the present disclosure.

Optionally, in combination with the above embodiments, in an embodiment of the present disclosure, any two metal layers of the first metal layer 031, the second metal layer 032, the third metal layer 033, and the fourth metal layer 034 in the compensation capacitor 03 may be disposed in different layers.

Figure 11:
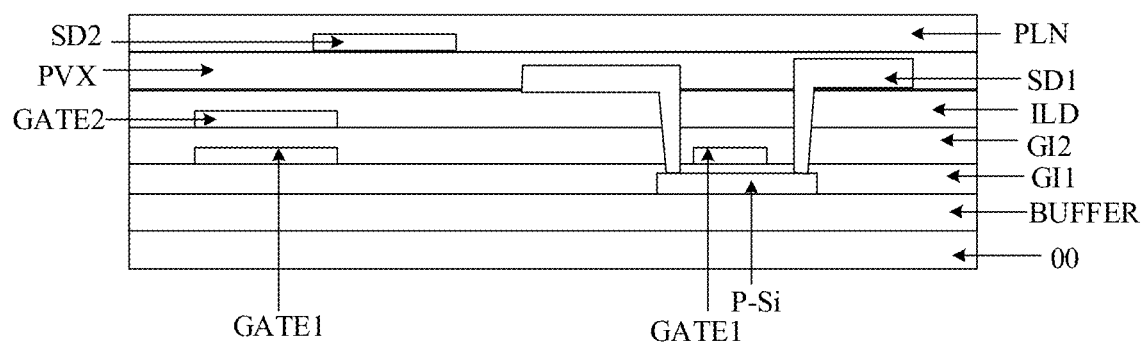
FIG. 11 is a schematic structural diagram of a pixel circuit according to an embodiment of the present disclosure.

Optionally, in combination with the structure shown in FIG. 11, the pixel circuits in the display panel may include: an active layer P—Si, a first gate metal layer GATE1, a second gate metal layer GATE2, a first source and drain metal layer SD1, and a second source and drain metal layer SD2 that are disposed successively along a direction going away from the base substrate 00; and a buffer layer BUFFER disposed between the active layer P—Si and the base substrate 00, a first gate insulation layer GI1 disposed between the active layer P—Si and the first gate metal layer GATE1, a second gate insulation layer GI2 disposed between the first gate metal layer GATE1 and the second gate metal layer GATE2, an inter-layer dielectric layer ILD disposed between the second gate metal layer GATE2 and the first source and drain metal layer SD1, and a passivation layer PVX disposed between the first source and drain metal layer SD1 and the second source and drain metal layer SD2. The first source and drain metal layer SD1 is coupled to the active layer P—Si.

In an embodiment of the present disclosure, the first metal layer 031 in each compensation capacitor 03 may be disposed in the same layer as one of the first gate metal layer GATE1 and the second gate metal layer GATE2, and the second metal layer 032 may be disposed in the same layer as the other gate metal layer of the first gate metal layer GATE1 and the second gate metal layer GATE2. The third metal layer 033 may be disposed in the same layer as one of the first source and drain metal layer SD1 and the second source and drain metal layer SD2, and the fourth metal layer 034 may be disposed in the same layer as the other source and drain metal layer of the first source and drain metal layer SD1 and the second source and drain metal layer SD2.

For example, referring to FIG. 9, in an embodiment of the present disclosure, the first metal layer 031 may be disposed in the same layer as the first gate metal layer GATE1, and the second metal layer 032 may be disposed in the same layer as the second gate metal layer GATE2. The third metal layer 033 may be disposed in the same layer as the first source and drain metal layer SD1, and the fourth metal layer 034 may be disposed in the same layer as the second source and drain metal layer SD2. In other words, each compensation capacitor 03 may include: one capacitor formed by overlapping the first gate metal layers GATE1 with the second gate metal layer GATE2; and the other capacitor formed by overlapping the first source and drain metal layers SD1 with the second source and drain metal layer SD2.

Being disposed in the same layer may refer to: forming, by the same film forming process, a film layer for forming a specific graph, and then patterning a formed layer structure on the film layer by a one-time patterning process using the same mask plate. Depending on different specific graphs, the one-time patterning process may likely include a multiple exposure, developing or etching process, and the specific graphs in the formed layer structure may be continuous or may be discontinuous. That is, a plurality of elements, components, structures and/or parts disposed in "the same layer" are made of the same material and formed by the same one-time patterning process.

Disposing the metal layers in the compensation capacitors 03 in the same layers as the metal layers in the pixel circuits can simplify processes and reduce costs. In some embodiments, metal layers independent of the pixel circuits may also be provided to form the compensation capacitors disclosed in the above embodiments.

Figure 12:
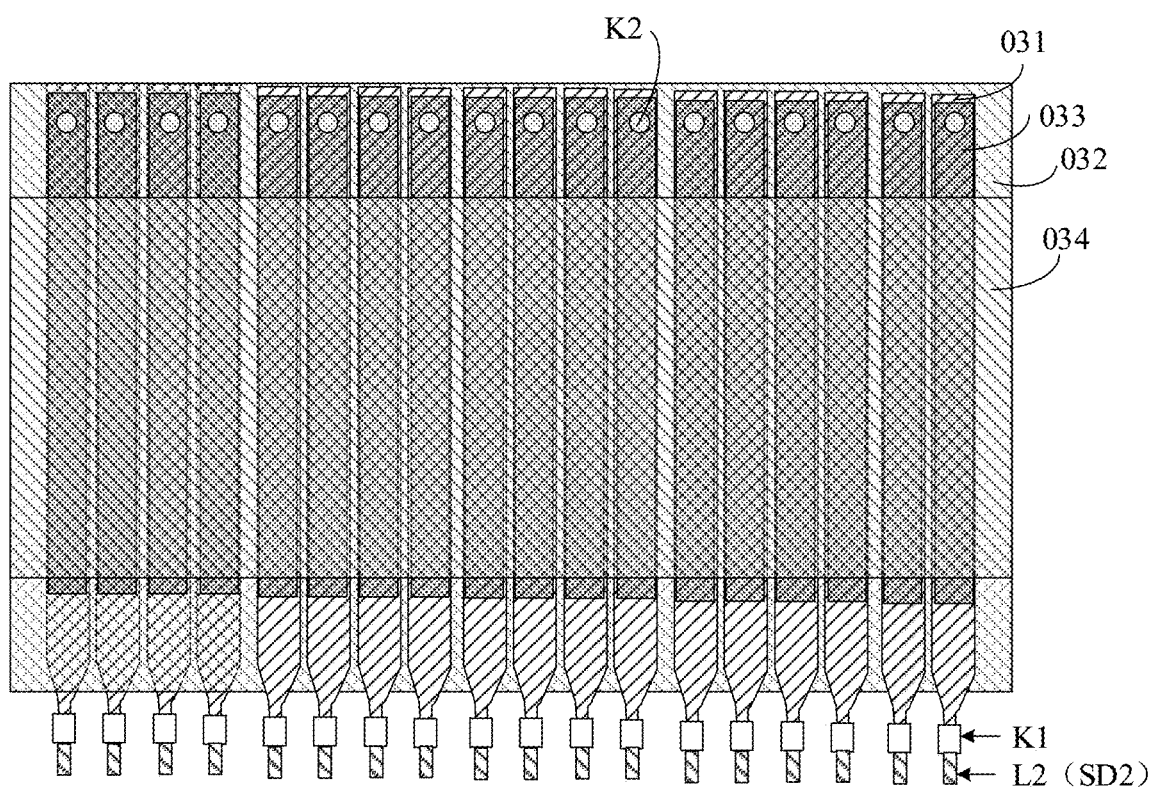
FIG. 12 is a structural layout of a part of a compensation capacitor in still another display panel according to an embodiment of the present disclosure.
Figure 13:
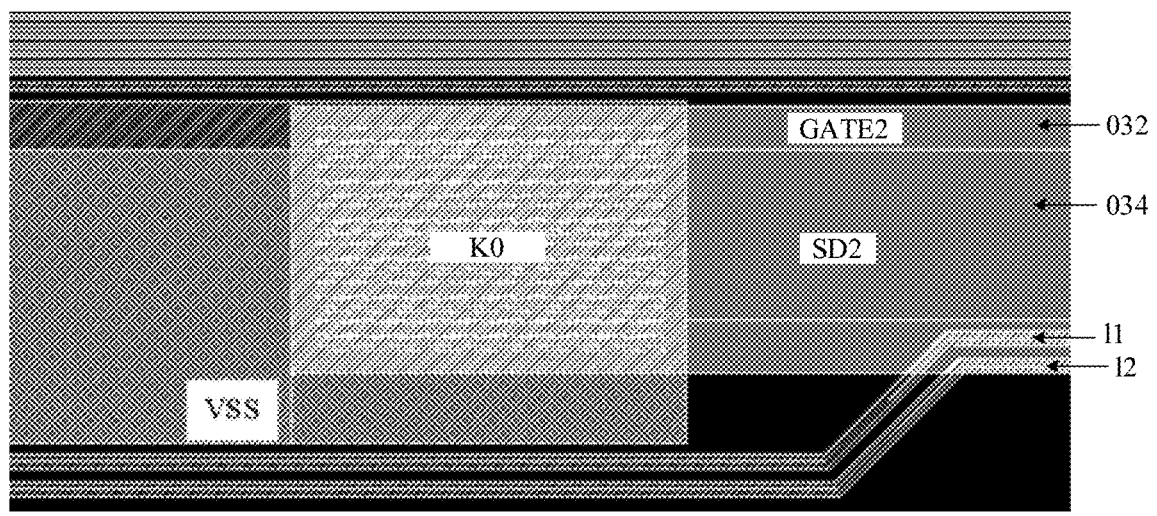
FIG. 13 is a structural layout of a part of a compensation capacitor in still another display panel according to an embodiment of the present disclosure.

Taking the structure shown in FIG. 9 as an example, FIG. 12 shows a structural layout of a part of a compensation capacitor in a display panel, and FIG. 13 shows a structural layout of the other part of a compensation capacitor in a display panel.

Optionally, referring to FIG. 9, FIG. 12, and FIG. 13, in an embodiment of the present disclosure, the second metal layers 032 in various compensation capacitors 03 may be of an integral structure. That is, various compensation capacitors 03 may share one second metal layer 032. The fourth metal layers 034 in various compensation capacitors 03 may also be of an integral structure. That is, various compensation capacitors 03 may share one fourth metal layer 034.

Moreover, referring to FIG. 13, the second metal layer 032 and the fourth metal layer 034 may be coupled to the power supply end VSS by the same adapter hole K0. Since the second metal layer 032 and the fourth metal layer 034 are coupled to the power supply end VSS, providing only one second metal layer 032 and/or providing only one fourth metal layer 034 can simplify structures, reduce costs, and facilitate narrow frame designs of the display panel on the premise of ensuring effective compensations.

In some embodiments, the second metal layers 032 in various compensation capacitors 03 may also be independent of each other and spaced apart from each other. The fourth metal layers 034 in various compensation capacitors 03 may also be independent of each other and spaced apart from each other. This is not limited in the embodiments of the present disclosure.

FIG. 13 further shows two signal lines 11 and 12 in the pixel circuit that are coupled to a clock signal end. The two signal lines 11 and 12 are generally disposed between the compensation capacitor 03 and the plurality of first pixel circuits 02.

Optionally, in combination with FIG. 12 and FIG. 13, the first metal layers 031 in various compensation capacitors 03 may be spaced apart along the pixel row direction X1. That is, the first metal layers 031 in compensation capacitors 03 may also be independent of each other. The third metal layers 033 in various compensation capacitors 03 may also be spaced apart along the pixel row direction X1. That is, the third metal layers 033 in compensation capacitors 03 may also be independent of each other.

Moreover, in combination with FIG. 9 and FIG. 12, in an embodiment of the present disclosure, orthographic projections of the first metal layers 031 on the base substrate 00 and orthographic projections of the third metal layers 033 on the base substrate 00 may be all of a strip-shaped structure. Moreover, the strip-shaped structures may extend along the pixel column direction X2, and are coupled to the target nodes P1.

In some embodiments, the first metal layers 031 and the third metal layers 033 may not be overlapped as well, and the first metal layers 031 and the third metal layers 033 may also be in other shapes, for example, an ellipse.

Figure 14:
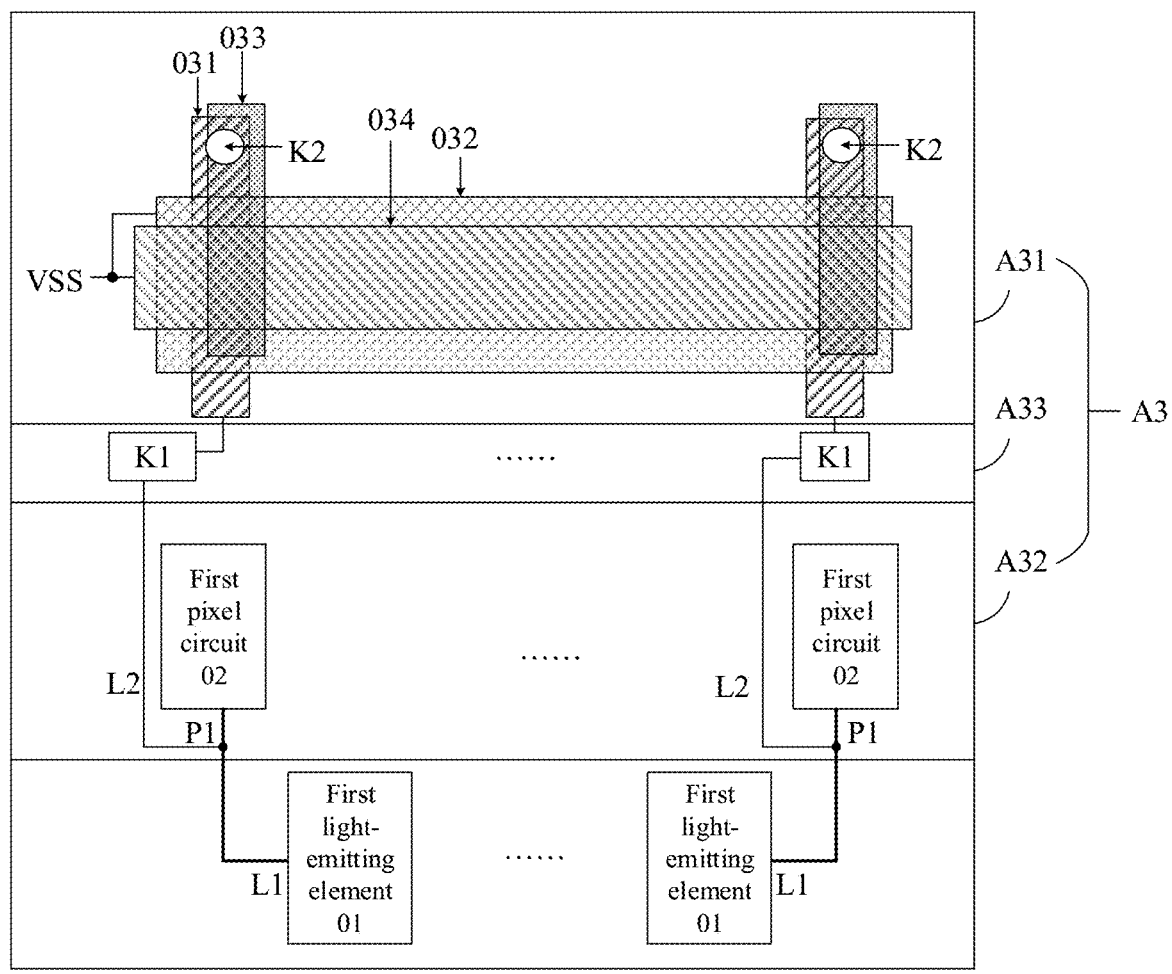
FIG. 14 is a schematic structural diagram of still another display panel according to an embodiment of the present disclosure.

Optionally, still referring to the structure of still another display panel shown in FIG. 12 and FIG. 14, the display panel may further include at least one second connecting wire L2 disposed in the peripheral region A3. Both the first metal layers 031 and the third metal layers 033 may be coupled to the target nodes P1 by the second connecting wires L2.

In an exemplary embodiment, in combination with FIG. 12 and FIG. 14, that the metal layers 031 may be coupled to the second connecting wires L2 by first via holes K1, and the third metal layers 033 may be coupled to the first metal layers 031 by second via holes K2. In some embodiments, it may also be possible that the third metal layers 033 are coupled to the second connecting wires L2 by the first via holes K1, and then, the first metal layers 031 are coupled to the third metal layers 033 by the second via holes K2. That is, in the embodiment of the present disclosure, one target metal layer of the first metal layer 031 and the third metal layer 033 may be configured to be coupled to the second connecting wire L2 directly, and then, the other metal layer other than the target metal layer is configured to be coupled to the target metal layer directly. That is, the other metal layer other than the target metal layer may be coupled to the second connecting wire L2 indirectly. In some embodiments, it may also be possible that one part of the first metal layers 031 are coupled to the second connecting wires L2 by the first via holes K1, and the other part of the third metal layers 033 are coupled to the second connecting wires L2 by the first via holes K1.

Optionally, in combination with FIG. 9, each second connecting wire L2 in the display panel may be disposed in the same layers as the second source and drain metal layers SD2 in the pixel circuits. As such, structures are simplified and costs are reduced.

Figure 15:
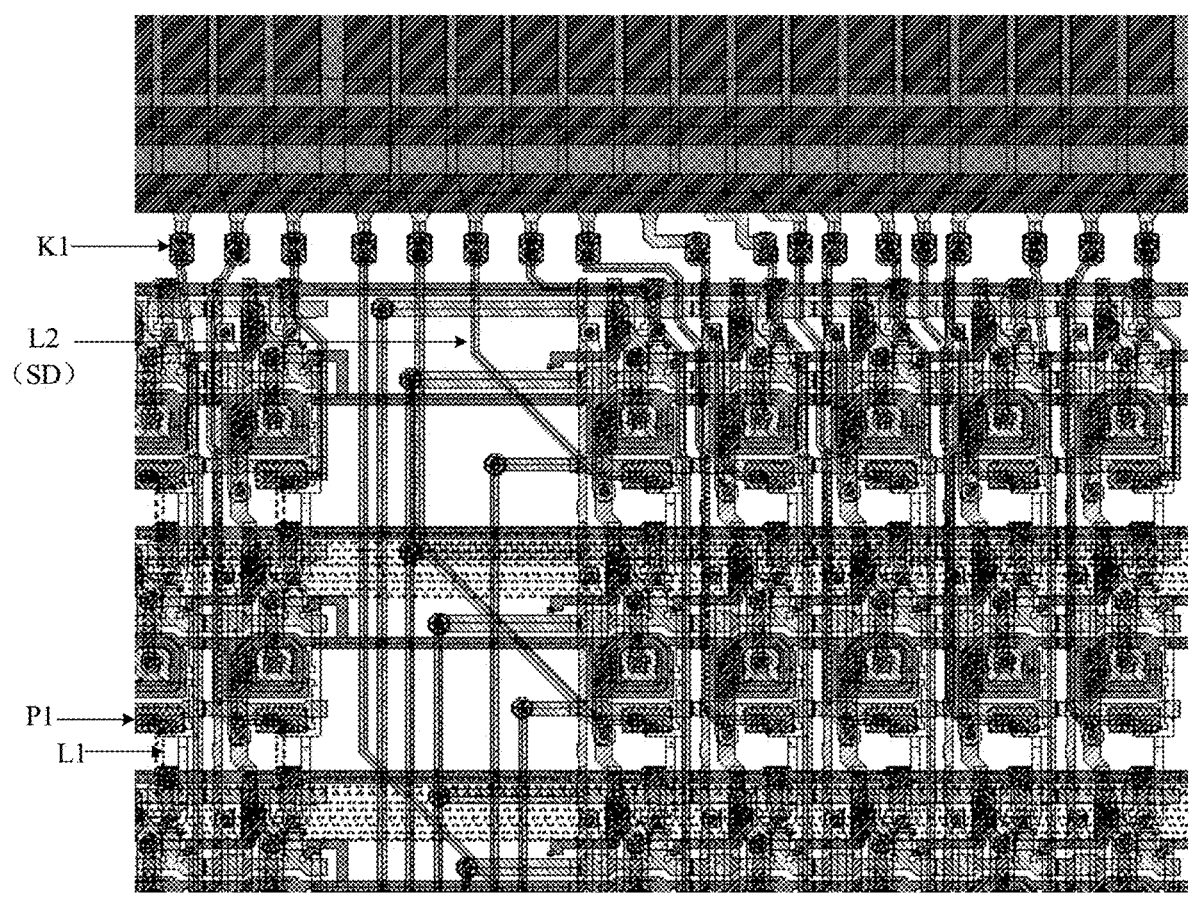
FIG. 15 is a schematic structural diagram of still another display panel according to an embodiment of the present disclosure.

Taking the structure shown in FIG. 14 as an example, FIG. 15 shows a structural layout of part of areas in a display panel. In combination with FIG. 12, FIG. 14, and FIG. 15, the first metal layers 031 and the third metal layers 033 in each compensation capacitor 03 may be coupled to one end of the second connecting wire L2 by one first via hole K1, and then, the other end of the second connecting wire L2 is coupled to the target node P1. Moreover, in combination with FIG. 12, FIG. 14, and FIG. 15, first via holes K1 may be spaced apart successively along the pixel row direction X1, and second via holes K2 may also be spaced apart successively along the pixel row direction X1.

Figure 16:
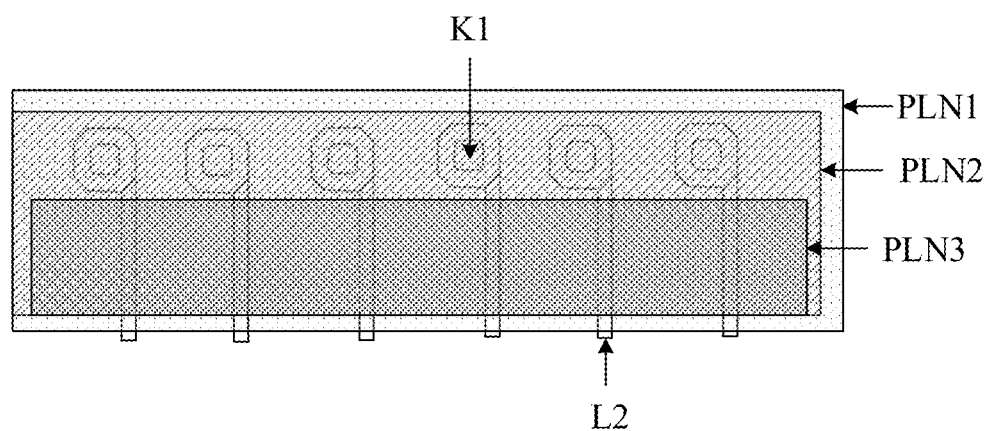
FIG. 16 is a schematic structural diagram of a display panel including a planarization layer and a via hole according to an embodiment of the present disclosure.

Optionally, referring to the display panel shown in FIG. 16, in an embodiment of the present disclosure, the display panel may further include a first planarization layer PLN1, a second planarization layer PLN2, and a third planarization layer PLN3 that are disposed successively along a direction of the first via holes K1 distal from the base substrate 00.

An orthographic projection of the first planarization layer PLN1 on the base substrate 00 may cover orthographic projections of the first via holes K1 on the base substrate 00, an orthographic projection of the second planarization layer PLN2 on the base substrate 00 may cover the orthographic projections of the first via holes K1 on the base substrate 00, and an orthographic projection of the third planarization layer PLN3 on the base substrate 00 may not be overlapped with the orthographic projections of the first via holes K1 on the base substrate 00.

Optionally, still referring to FIG. 16, the first planarization layer PLN1, the second planarization layer PLN2, and the third planarization layer PLN3 may all be disposed on the side of second connecting wire L2 distal from the base substrate 00.

As such, the problem of wire breaking caused by large laminated segment differences in the first planarization layer PLN1, the second planarization layer PLN2, and the third planarization layer PLN3 can be avoided compared with the prior art in which the first planarization layer PLN1, the second planarization layer PLN2, and the third planarization layer PLN3 all cover the first via holes K1.

Figure 17:
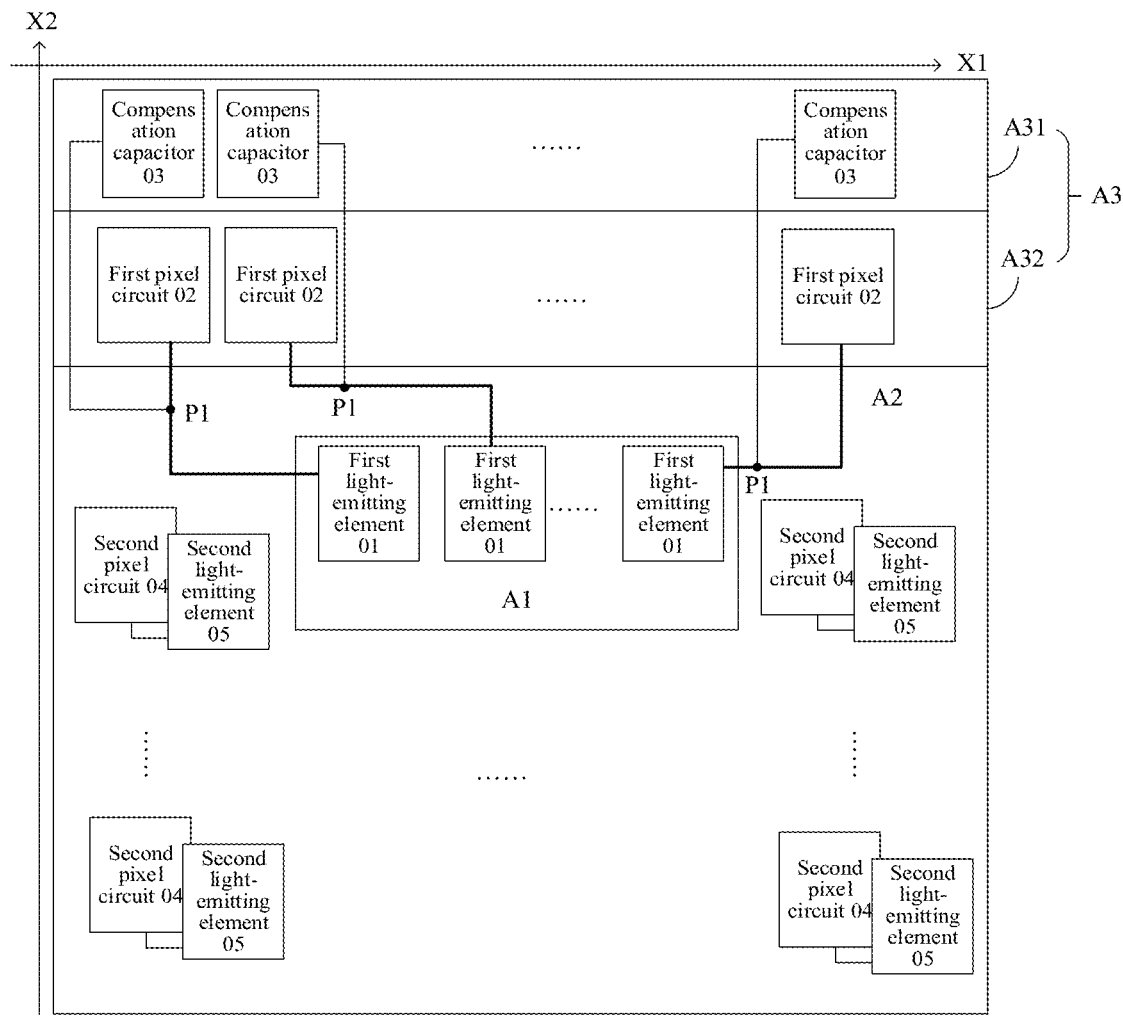
FIG. 17 is a schematic structural diagram of still another display panel according to an embodiment of the present disclosure.

FIG. 17 is a schematic structural diagram of still another display panel according to an embodiment of the present disclosure. In combination with FIG. 14 and FIG. 17, the peripheral region A3 may include a first area A31 and a second area A32 that are disposed in the pixel column direction X2. Moreover, the second area A32 is proximal to the second display region A2 relative to the first area A31.

Optionally, on the premise of dividing the peripheral region A3 into the first area A31 and the second area A32, first pixel circuits 02 in the display panel may be disposed in the second area A32, and compensation capacitors 03 in the display panel may be disposed in the first area A31.

In combination with FIG. 14 and FIG. 17, with such a configuration, the first pixel circuits 02 may conveniently be coupled to the first light-emitting elements 01, and the lengths of the first connecting wires L1 may be reduced as much as possible, so as to reduce wiring costs and simplify wiring. In combination with the structure shown in FIG. 17, a plurality of first pixel circuits 02 and compensation capacitors 03 shown in the figure may be considered actually to be disposed on one side of the upper frame of the display panel.

Furthermore, on the premise of the structure shown in FIG. 17, still referring to FIG. 12 and FIG. 14, the first via holes K1 disclosed in the above embodiments may be disposed in a third area A33 of the peripheral region A3, and the third area A33 may be disposed between the first area A31 and the second area A32 of the peripheral region A3. The second via holes K2 disclosed in the above embodiments may be disposed in the first area A31 of the peripheral region A3.

Optionally, in order to further achieve better light transmittance of the first display region A1, the first connecting wires L1 disclosed in the embodiments of the present disclosure may be transparent conductive wires. For example, the first connecting wires L1 may be made of a transparent material such as indium tin oxide (ITO) or indium gallium zinc oxide (IGZO). If the first connecting wires L1 are made of an ITO material, the first connecting wires L1 may also be called ITO wires.

Optionally, in combination with the above figures, the display panel may generally include a plurality of first connecting wires L1, and at least two first connecting wires L1 of the plurality of first connecting wires L1 may be disposed in different layers.

Figure 18:
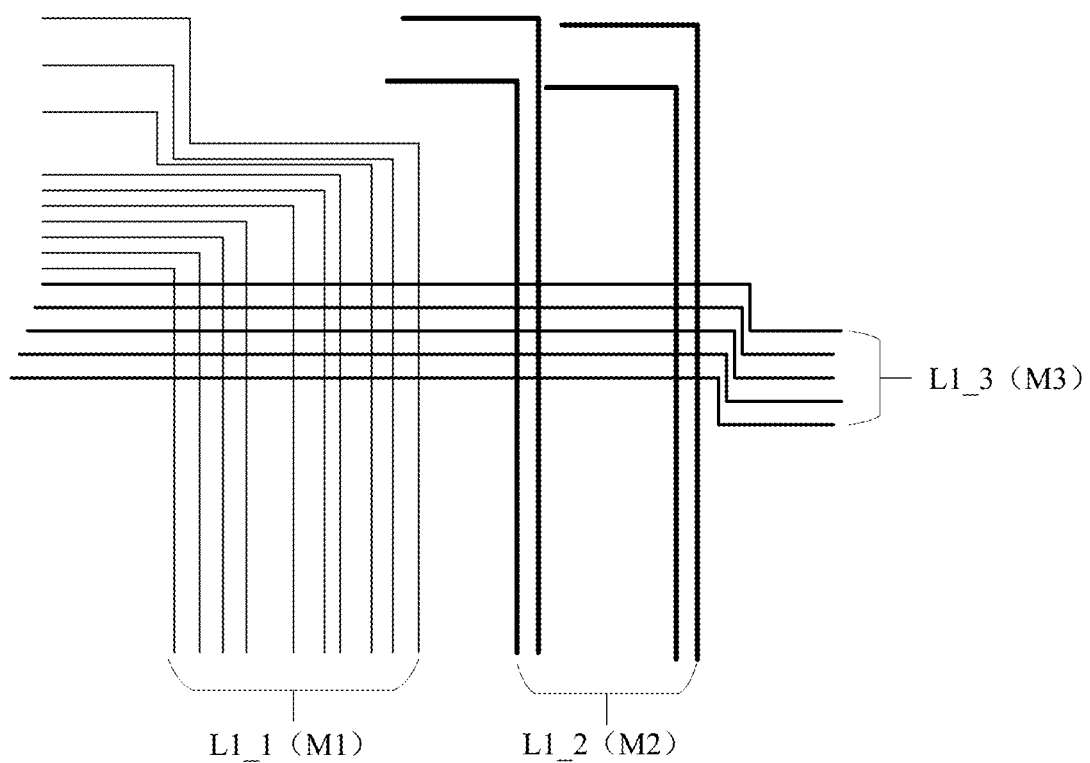
FIG. 18 is a schematic structural diagram of a first connecting wire according to an embodiment of the present disclosure.

For example, FIG. 18 is a schematic structural diagram of a display panel including a first connecting wire L1 according to an embodiment of the present disclosure. As shown in FIG. 18, a plurality of first connecting wires L1 may include at least one first type first connecting wire L1_1 disposed in the same layer, at least one second type first connecting wire L1_2 disposed in the same layer, and at least one third type first connecting wire L1_3 disposed in the same layer. In combination with FIG. 18, it can be further determined that the lengths of different first connecting wires L1 are generally different.

Figure 19:
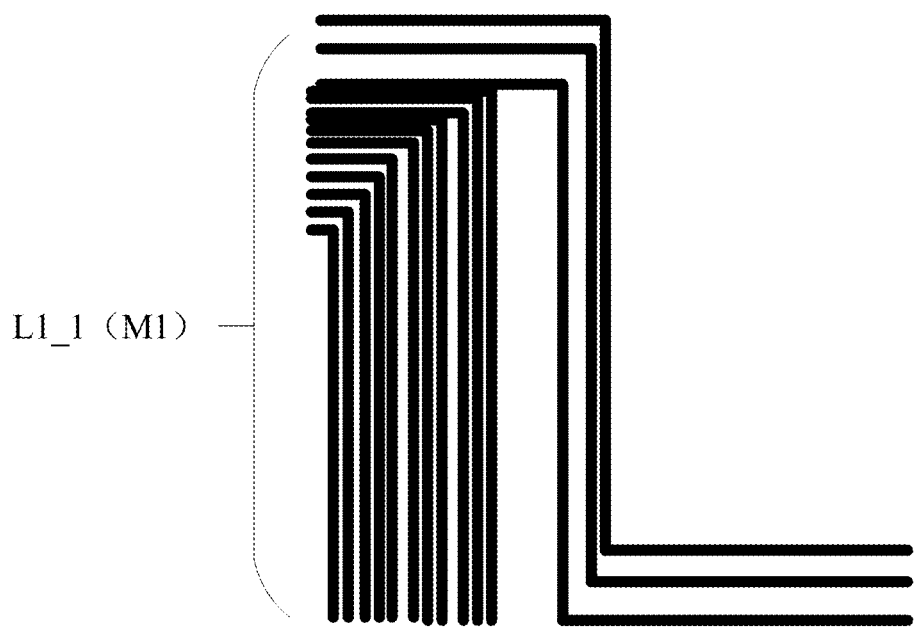
FIG. 19 is a schematic structural diagram of a first type first connecting wire according to an embodiment of the present disclosure.
Figure 20:
FIG. 20 is a schematic structural diagram of a second type first connecting wire according to an embodiment of the present disclosure.
Figure 21:
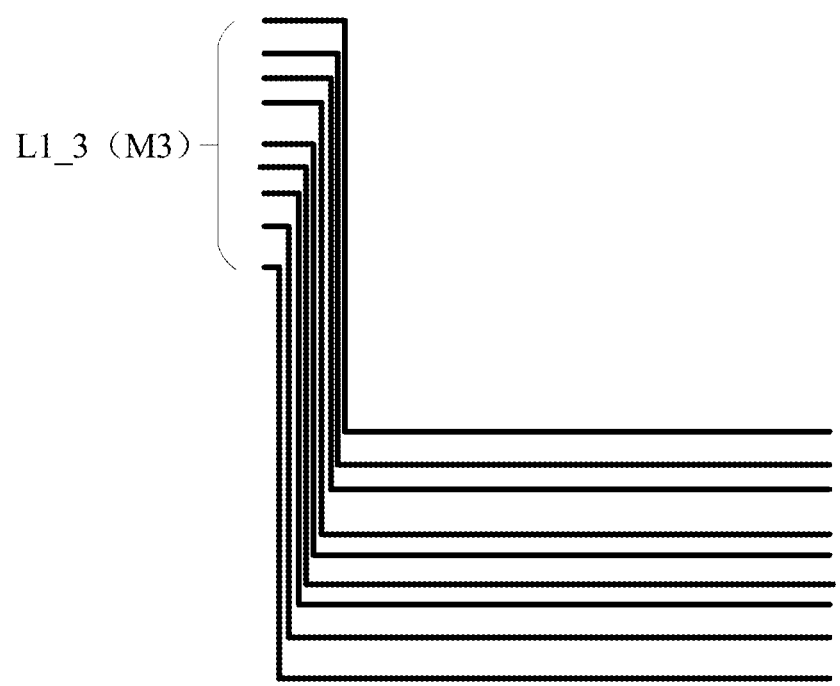
FIG. 21 is a schematic structural diagram of a third type first connecting wire according to an embodiment of the present disclosure.

First connecting wires L1 of any two types of the first type first connecting wires L1_1, the second type first connecting wires L1_2, and the third type first connecting wires L1_3 may be disposed in different layers. As such, wiring is facilitated. For example, referring to FIG. 19 to FIG. 21, the first type first connecting wires L1_1 may be disposed in the same layers as metal layers M1, the second type first connecting wires L1_2 may be disposed in the same layers as metal layers M2, and the third type first connecting wires L1_3 may be disposed in the same layers as metal layers M3.

Optionally, the metal layers M1 to the metal layers M3 may be disposed in the same layers as the metal layers in the display panel, or may also be metal layers additionally provided separately.

Optionally, the first display region A1 may be divided into three areas in the pixel column direction and/or the pixel row direction. Each of first light-emitting elements 01 within the same area may be coupled to the first pixel circuits 02 by the first type first connecting wires L1_1. Each of first light-emitting elements 01 within the same area may be coupled to the first pixel circuits 02 by the second type first connecting wires L1_2. Each of first light-emitting elements 01 within the same area may be coupled to the first pixel circuits 02 by the third type first connecting wires L1_3.

Figure 22:
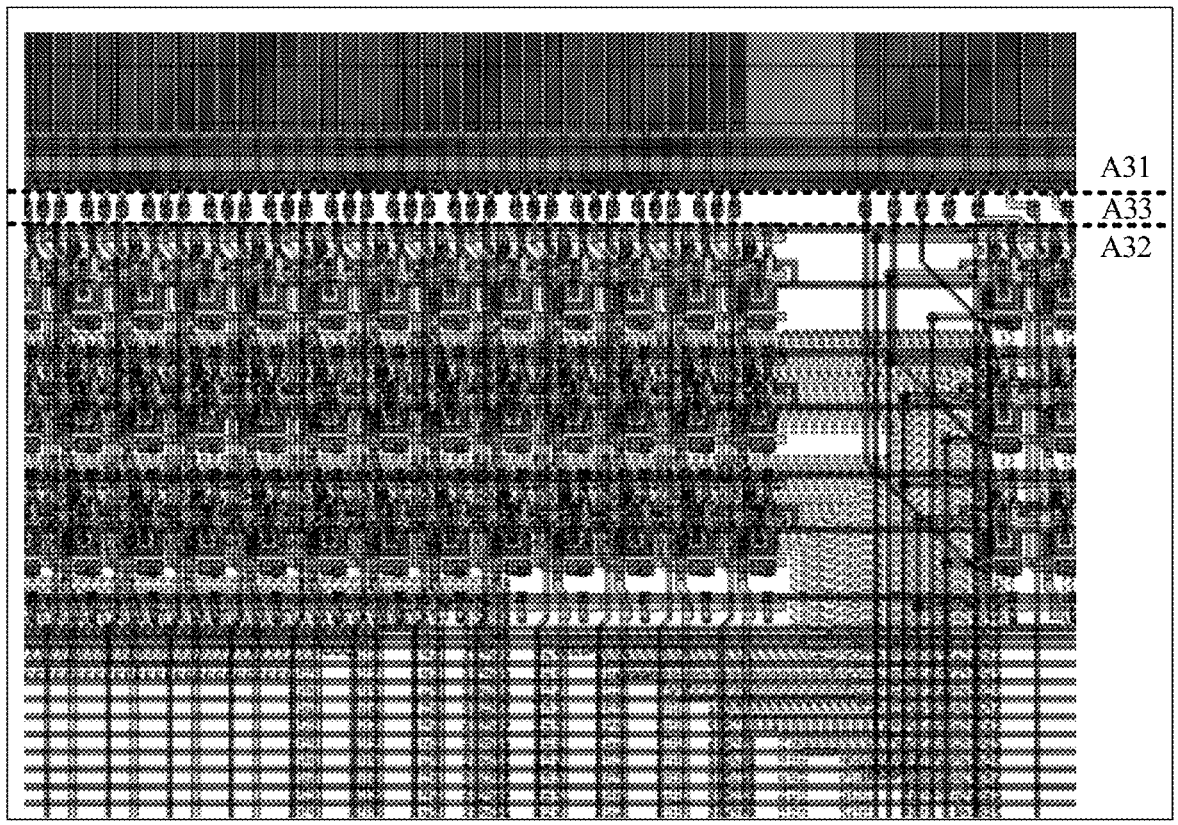
FIG. 22 is a schematic structural diagram of still another display panel according to an embodiment of the present disclosure.

Optionally, taking the display panel disclosed in the above embodiment as an example, FIG. 22 shows a layout of part of areas of the whole structure for a display panel. Referring to FIG. 22, the via holes by which the compensation capacitors 03 are coupled to the second connecting wires L2 are disposed in the third area A33 of the peripheral region A3.

In summary, in an embodiment of the present disclosure, a display panel is provided. The display panel includes a first light-emitting element disposed in a first display region, and a first pixel circuit and a compensation capacitor that are disposed in a peripheral region. The first pixel circuit may be coupled to the first light-emitting element by a first connecting wire. A first metal layer in the compensation capacitor may be coupled to a target node, a second metal layer may be coupled to a power supply end, and the target node is a node via which the first connecting wire is coupled to the first pixel circuit. As such, an effective compensation for a parasitic capacitor on the first connecting wire can achieve better uniformity of light-emitting luminance of various first light-emitting elements in the first display region, and thus, the display panel can achieve better display effects.

Figure 23:
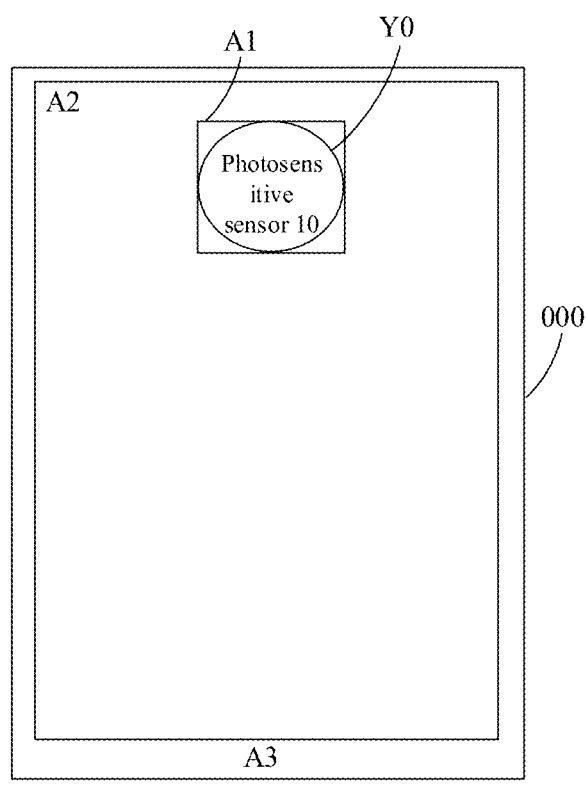
FIG. 23 is a schematic structural diagram of a display device according to an embodiment of the present disclosure.

FIG. 23 is a schematic structural diagram of a display device according to an embodiment of the present disclosure. As shown in FIG. 23, the display device may include a photosensitive sensor 10 and the display panel 000 as shown in the above figures. The photosensitive sensor 10 may be disposed within the first display region A1 of the display panel 000.

Optionally, the first display region A1 may be the rectangle shown in FIG. 23, and the area of an orthographic projection of the photosensitive sensor 10 on the base substrate 00 may be less than or equal to the area of an inscribed circle of the first display region A1. That is, the size of the area where the photosensitive sensor 10 is disposed may be less than or equal to the area of the inscribed circle of the first display region A1. For example, in combination with FIG. 23, in the display panel shown in the figure, the size of the area where the photosensitive sensor 10 is disposed is or equal to the size of the inscribed circle Y0 of the first display region A1. That is, the area where the photosensitive sensor 10 is disposed may be circular. Correspondingly, the area where the photosensitive sensor 10 is disposed may also be called a light-transmissive hole. In some embodiments, the first display region A1 may also be in other shapes other than the rectangle, for example, a circle.

Optionally, the display device may be an OLED display device, an active-matrix organic light-emitting diode (AMOLED) display device, a mobile phone, a tablet computer, a flexible display device, a television, a display, and any other products or components with display functions.

The terms used in the detailed description of the present disclosure are merely for the purpose of explaining the embodiments of the present disclosure, and are not intended to define the present disclosure. Unless otherwise defined, technical terms or scientific terms used in the detailed description of the present disclosure should have common meanings understood by those of ordinary skills in the art.

The terms "first," "second," "third," and the like used in the patent application description and claims of the present disclosure do not indicate any order, number or importance, but are used only to distinguish between different constituents. Likewise, the singular form "one," "a/an," or the like also does not indicate limitation of number, but indicates that at least one exists. The term "comprise" or "include" or the like means that an element or item preceding "comprise" or "include" encompasses elements or items listed behind "comprise" or "include" and equivalents thereof, and does not exclude other elements or items. The terms such as "upper," "lower," "left," and "right" are merely used to indicate a relative positional relationship, and the relative positional relationship may change correspondingly if an absolute position of the described object changes.

The term "and/or" mentioned herein indicates that three relationships may exist, for example, A and/or B may indicate three situations: A exists separately, both A and B exist, and B exists separately. The symbol "/" usually indicates that former and latter objects associated are in an "or" relationship.

It can be clearly learned by those skilled in the art that for the purpose of convenient and brief description, for specific working processes of the display panel and display device described above, reference can be made to corresponding processes in the foregoing method embodiments, which will not be described herein again.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display panel, comprising:
   a base substrate, comprising a first display region, a second display region, and a peripheral region, wherein the second display region at least partially surrounds the first display region, and the peripheral region at least partially surrounds the second display region;
   a plurality of first light-emitting elements in the first display region;
   a plurality of first pixel circuits in the peripheral region;
   a plurality of second pixel circuits and a plurality of second light-emitting elements in the second display region, wherein at least one of the second pixel circuits is coupled to at least one of the second light-emitting elements;
   at least one first connecting wire in the peripheral region, the second display region, and the first display region, wherein at least one of the first pixel circuits is coupled to at least one of the first light-emitting elements by the first connecting wire; and
   at least one compensation capacitor in the peripheral region, wherein the compensation capacitor comprises a first metal layer and a second metal layer that are overlapped, the first metal layer being coupled to a target node, the second metal layer being coupled to a power supply end, and the target node being a node via which the first pixel circuits are coupled to the first connecting wire.

2. The display panel according to claim 1, wherein a capacitance of the compensation capacitor corresponding to each of the first pixel circuits is negatively correlated with a length of the first connecting wire coupled.

3. The display panel according to claim 2, wherein in the compensation capacitor corresponding to each of the first pixel circuits, an overlap region of two metal layers that are overlapped is negatively correlated with the length of the first connecting wire coupled.

4. The display panel according to claim 1, wherein the display panel comprises a plurality of pixel circuit groups, each of the pixel circuit groups comprising at least two of the first pixel circuits;
   wherein capacitances of compensation capacitors corresponding to each of the pixel circuit groups are equal, and capacitances of compensation capacitors corresponding to different pixel circuit groups are different.

5. The display panel according to claim 4, wherein the plurality of pixel circuit groups comprise: a first sub pixel circuit group, a second sub pixel circuit group, and a third sub pixel circuit group that are spaced apart successively along a pixel row direction;
   wherein capacitances of compensation capacitors corresponding to the first sub pixel circuit group are less than capacitances of compensation capacitors corresponding to the second sub pixel circuit group, and capacitances of compensation capacitors corresponding to the second sub pixel circuit group are greater than capacitances of compensation capacitors corresponding to the third sub pixel circuit group.

6. The display panel according to claim 1, wherein the peripheral region comprises a first area and a second area that are along a pixel column direction, the second area being proximal to the second display region relative to the first area;
   wherein each of the first pixel circuits is in the first area, and each of the at least one compensation capacitor is in the second area.

7. The display panel according to claim 1, wherein the display panel comprises at least one selected from:
   a plurality of compensation capacitors, wherein the second metal layer in each of the compensation capacitors is of an integral structure, and first metal layers in each of the compensation capacitors are spaced apart along the pixel row direction;

at least one compensation capacitor in a one-to-one correspondence with the at least one first connecting wire, wherein each of the at least one compensation capacitor is coupled to a corresponding one of the at least one first connecting wire at the target node; or a plurality of first connecting wires, wherein at least two first connecting wires of the plurality of first connecting wires are in different layers.

8. The display panel according to claim 7, wherein the display panel comprises the plurality of first connecting wires, the plurality of first connecting wires comprise at least one first type first connecting wire in a same layer, at least one second type first connecting wire in a same layer, and at least one third type first connecting wire in a same layer;

wherein first connecting wires of any two types of the first type first connecting wire, the second type first connecting wire, and the third type first connecting wire are in different layers.

9. The display panel according to claim 1, wherein the at least one compensation capacitor comprises a plurality of first-group compensation capacitors, wherein at least one of the first-group compensation capacitors comprises a third metal layer and a fourth metal layer that are overlapped, and any two metal layers of the first metal layer, the second metal layer, the third metal layer, and the fourth metal layer are in different layers;

wherein the third metal layer is coupled to the target node, and the fourth metal layer is coupled to the power supply end.

10. The display panel according to claim 9, wherein the at least one compensation capacitor further comprises: a plurality of second-group compensation capacitors and a plurality of third-group compensation capacitors; and the at least one of the first-group compensation capacitors further comprises a first metal layer and a second metal layer that are overlapped, wherein at least one of the second-group compensation capacitors further comprises a first metal layer and a second metal layer that are overlapped, and at least one of the third-group compensation capacitors further comprises a first metal layer and a second metal layer that are overlapped;

wherein the plurality of first-group compensation capacitors, the plurality of second-group compensation capacitors, and the plurality of third-group compensation capacitors are spaced apart successively along the pixel row direction, and heights of first metal layers in the second-group compensation capacitors in the pixel column direction are greater than heights of first metal layers in the third-group compensation capacitors along the pixel column direction, and greater than heights of first metal layers in the second-group compensation capacitors along the pixel column direction.

11. The display panel according to claim 9, wherein the pixel circuits in the display panel comprise: an active layer, a first gate metal layer, a second gate metal layer, a first source and drain metal layer, and a second source and drain metal layer that are successively along a direction going away from the base substrate; wherein the first metal layer i in a same layer as one of the first gate metal layer and the second gate metal layer, and the second metal layer is in a same layer as the other gate metal layer of the first gate metal layer and the second gate metal layer; and the third metal layer is in a same layer as one of the first source and drain metal layer and the second source and drain metal layer, and the fourth metal layer is in a same layer as the other of the first source and drain metal layer and the second source and drain metal layer.

12. The display panel according to claim 11, wherein the respective metal layers meet one of the following requirements:

the first metal layer is in a same layer as the first gate metal layer, and the second metal layer is in a same layer as the second gate metal layer; or the third metal layer is in a same layer as the first source and drain metal layer, and the fourth metal layer is in a same layer as the second source and drain metal layer.

13. The display panel according to claim 9, wherein each of the compensation capacitors comprises: the first metal layer and the second metal layer that are overlapped and the third metal layer and the fourth metal layer that are overlapped.

14. The display panel according to claim 9, wherein the fourth metal layer in each of the compensation capacitors is of an integral structure, and the third metal layers in each of the compensation capacitors are spaced apart along the pixel row direction.

15. The display panel according to claim 9, further comprising:

at least one second connecting wire in the peripheral region, wherein both the first metal layer and the third metal layer are coupled to the target nodes by the at least one second connecting wire.

16. The display panel according to claim 15, wherein the peripheral region comprises: a first area, a third area, and a second area that are along the pixel column direction, wherein the second area is proximal to the second display region relative to the first area; and the first metal layer is coupled to the second connecting wire by a first via hole, and the third metal layer is coupled to the first metal layer by a second via hole;

wherein the first via hole is in the third area of the peripheral region, and the second via hole is in the first area of the peripheral region.

17. The display panel according to claim 16, further comprising: a first planarization layer, a second planarization layer, and a third planarization layer that are successively along a direction of the first via holes distal from the base substrate;

wherein an orthographic projection of the first planarization layer on the base substrate covers an orthographic projection of the first via hole on the base substrate, an orthographic projection of the second planarization layer on the base substrate covers the orthographic projection of the first via hole on the base substrate, and an orthographic projection of the third planarization layer on the base substrate is not overlapped with the orthographic projection of the first via hole on the base substrate.

18. The display panel according to claim 17, wherein the first planarization layer, the second planarization layer, and the third planarization layer are all on a side of the second connecting wire distal from the base substrate.

19. The display panel according to claim 15, wherein the second connecting wire is in a same layer as the second source and drain metal layers in the pixel circuits of the display panel.

20. A display device, comprising: a photosensitive sensor and a display panel;

wherein the display panel comprises:

a base substrate, comprising a first display region, a second display region, and a peripheral region, wherein the second display region at least partially surrounds the first display region, and the peripheral region at least partially surrounds the second display region;
a plurality of first light-emitting elements in the first display region;
a plurality of first pixel circuits in the peripheral region;
a plurality of second pixel circuits and a plurality of second light-emitting elements in the second display region, wherein at least one of the second pixel circuits is coupled to at least one of the second light-emitting elements;
at least one first connecting wire in the peripheral region, the second display region, and the first display region, wherein at least one of the first pixel circuits is coupled to at least one of the first light-emitting elements by the first connecting wire; and
at least one compensation capacitor in the peripheral region, wherein the compensation capacitor comprises a first metal layer and a second metal layer that are overlapped, the first metal layer being coupled to a target node, the second metal layer being coupled to a power supply end, and the target node being a node via which the first pixel circuits are coupled to the first connecting wire;
wherein the photosensitive sensor is in the first display region of the display panel.

* * * * *